US012562719B2

(12) United States Patent
Gustafsson et al.

(10) Patent No.: US 12,562,719 B2
(45) Date of Patent: Feb. 24, 2026

(54) SIGNAL PRE-SHAPING TO SUPPRESS POWER SUPPLY DISTURBANCES

(71) Applicant: Telefonaktiebolaget LM Ericsson (publ), Stockholm (SE)

(72) Inventors: Björn Gustafsson, Lund (SE); Emil Pettersson, Helsingborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 413 days.

(21) Appl. No.: 18/449,945

(22) Filed: Aug. 15, 2023

(65) Prior Publication Data

US 2024/0421804 A1 Dec. 19, 2024

Related U.S. Application Data

(60) Provisional application No. 63/472,741, filed on Jun. 13, 2023.

(51) Int. Cl.
*H03K 3/78* (2006.01)
*H03K 3/84* (2006.01)

(52) U.S. Cl.
CPC ................. *H03K 3/78* (2013.01); *H03K 3/84* (2013.01)

(58) Field of Classification Search
CPC ................................... H03K 3/78; H03K 3/84
See application file for complete search history.

(56) References Cited

U.S. PATENT DOCUMENTS

| | | | |
|---|---|---|---|
| 4,950,913 A | 8/1990 | Kephart | |
| 5,272,386 A | 12/1993 | Kephart | |
| 5,563,452 A | 10/1996 | Kephart | |
| 6,463,137 B1 | 10/2002 | Vanjani et al. | |
| 7,362,739 B2 | 4/2008 | Cherukuri et al. | |
| 7,554,935 B2 | 6/2009 | Leppisaari et al. | |

(Continued)

FOREIGN PATENT DOCUMENTS

| | | |
|---|---|---|
| EP | 0693856 A2 | 1/1996 |
| EP | 4006868 A1 | 6/2022 |

(Continued)

*Primary Examiner* — Zhitong Chen
(74) *Attorney, Agent, or Firm* — Murphy, Bilak & Homiller, PLLC

(57) ABSTRACT

Embodiments include methods performed by an apparatus configured to generate output signals for transmission. Such methods include detecting a triggering condition related to a change in operational status of the apparatus and selecting one of a plurality of pre-shaping vectors based on the triggering condition and past operating conditions of the apparatus during a plurality of most recent time intervals. Each pre-shaping vector includes a plurality of values that compensate for effects of voltage variation of a power supply for the apparatus. Such methods include, during a plurality of time intervals after the triggering condition, applying the values of the selected pre-shaping vector to respective information-carrying signals, thereby generating pre-shaped information-carrying signals. Such methods include generating output signals for transmission during the plurality of subsequent time intervals, using the pre-shaped information-carrying signals. The output signals are generated by an active circuit powered by the power supply.

27 Claims, 16 Drawing Sheets

| Symbol Scaling | ... | | | 1.06 | 1.04 | 1.02 | ... | 1.01 | | ... |
|---|---|---|---|---|---|---|---|---|---|---|
| PAAM Branches in on state (RX, TX) | ... | 8, 0 | 8, 0 | 0, 8 | 0, 8 | 0, 8 | ... | 0, 8 | 0, 8 | ... |
| Symbol | ... | 12 | 13 | 0 | 1 | 2 | ... | 9 | 10 | ... |
| Slot | ... | N - 1, Uplink | | | N, Downlink | | | | | |

(56)     References Cited

U.S. PATENT DOCUMENTS

| | | | |
|---|---|---|---|
| 7,860,763 B1 | 12/2010 | Quinn et al. | |
| 7,957,428 B2 | 6/2011 | Steinman et al. | |
| 8,462,639 B2 | 6/2013 | Kirtley et al. | |
| 9,143,227 B2 | 9/2015 | Moynihan et al. | |
| 9,155,140 B2 | 10/2015 | Yavor | |
| 9,312,962 B2 | 4/2016 | Krause et al. | |
| 9,479,247 B2 | 10/2016 | Yu | |
| 9,702,923 B2 * | 7/2017 | Gaarder | H02J 13/00002 |
| 9,894,205 B1 | 2/2018 | Miller et al. | |
| 9,941,974 B2 | 4/2018 | Yu et al. | |
| 10,746,630 B2 | 8/2020 | Jalali et al. | |
| 10,755,563 B2 | 8/2020 | Takeda et al. | |
| 2008/0089698 A1 | 4/2008 | Jiang et al. | |
| 2009/0004981 A1 | 1/2009 | Eliezer et al. | |
| 2010/0207594 A1 * | 8/2010 | Davoudi | H02M 3/157 |
| | | | 323/283 |
| 2013/0038123 A1 * | 2/2013 | Wilkins | H02J 3/18 |
| | | | 307/18 |
| 2014/0292403 A1 * | 10/2014 | Liu | H04L 27/368 |
| | | | 330/149 |
| 2015/0029039 A1 | 1/2015 | Mukaiyama | |

FOREIGN PATENT DOCUMENTS

| | | | |
|---|---|---|---|
| WO | 0067419 A1 | 11/2000 | |
| WO | 2004064248 A1 | 7/2004 | |
| WO | 2010145284 A1 | 12/2010 | |
| WO | 2021094077 A1 | 5/2021 | |

* cited by examiner

| PAAM power on/off state (Number of PAAM branches in on state: RX, TX) | | | | | | |
| -5 | -4 | -3 | -2 | -1 | Trigger | Vector |
|---|---|---|---|---|---|---|
| | | | | >0 & <pbr, 0 | x, >0 & <pbt | 0 |
| | | | >0 & <pbr, 0 | 0, 0 | x, >0 & <pbt | 1 |
| | | >0 & <pbr, 0 | 0, 0 | 0, 0 | x, >0 & <pbt | 2 |
| | >0 & <pbr, 0 | 0, 0 | 0, 0 | 0, 0 | x, >0 & <pbt | 3 |
| | | | | >0 & <pbr, 0 | x,>= pbt | 4 |
| | | | >0 & <pbr, 0 | 0, 0 | x,>= pbt | 5 |
| | | >0 & <pbr, 0 | 0, 0 | 0, 0 | x,>= pbt | 6 |
| | >0 & <pbr, 0 | 0, 0 | 0, 0 | 0, 0 | x,>= pbt | 7 |
| | | | | >= pbr, 0 | x, >0 & <pbt | 8 |
| | | | >= pbr, 0 | 0, 0 | x, >0 & <pbt | 9 |
| | | >= pbr, 0 | 0, 0 | 0, 0 | x, >0 & <pbt | 10 |
| | >= pbr, 0 | 0, 0 | 0, 0 | 0, 0 | x, >0 & <pbt | 11 |
| | | | | >= pbr, 0 | x,>= pbt | 12 |
| | | | >= pbr, 0 | 0, 0 | x,>= pbt | 13 |
| | | >= pbr, 0 | 0, 0 | 0, 0 | x,>= pbt | 14 |
| | >= pbr, 0 | 0, 0 | 0, 0 | 0, 0 | x,>= pbt | 15 |
| | | | | 0, >= pbt | x, >0 & <pbt | 16 |
| | | | 0, >= pbt | 0, 0 | x, >0 & <pbt | 17 |
| | | 0, >= pbt | 0, 0 | 0, 0 | x, >0 & <pbt | 18 |
| | 0, >= pbt | 0, 0 | 0, 0 | 0, 0 | x, >0 & <pbt | 19 |
| >0 | 0, 0 | 0, 0 | 0, 0 | 0, 0 | x,>= pbt | 20 |
| | | | 0, >= pbt | 0, 0 | x,>= pbt | 21 |
| | | 0, >= pbt | 0, 0 | 0, 0 | x,>= pbt | 22 |
| | 0, >= pbt | 0, 0 | 0, 0 | 0, 0 | x,>= pbt | 23 |
| >0 | 0, 0 | 0, 0 | 0, 0 | 0, 0 | x, >0 & <pbt | 24 |
| | | | 0,>0 & <pbt | 0, 0 | x, >0 & <pbt | 25 |
| | | 0,>0 & <pbt | 0, 0 | 0, 0 | x, >0 & <pbt | 26 |
| | 0,>0 & <pbt | 0, 0 | 0, 0 | 0, 0 | x, >0 & <pbt | 27 |
| | | | | 0, >0 & <pbt | x,>= pbt | 28 |
| | | | 0, >0 & <pbt | 0, 0 | x,>= pbt | 29 |
| | | 0, >0 & <pbt | 0, 0 | 0, 0 | x,>= pbt | 30 |
| | 0, >0 & <pbt | 0, 0 | 0, 0 | 0, 0 | x,>= pbt | 31 |
| 0, 0 | 0, 0 | 0, 0 | 0, 0 | 0, 0 | x, >0 & <pbt | 32 |
| 0, 0 | 0, 0 | 0, 0 | 0, 0 | 0, 0 | x,>= pbt | 33 |

*FIG. 5*

Figure 16A:
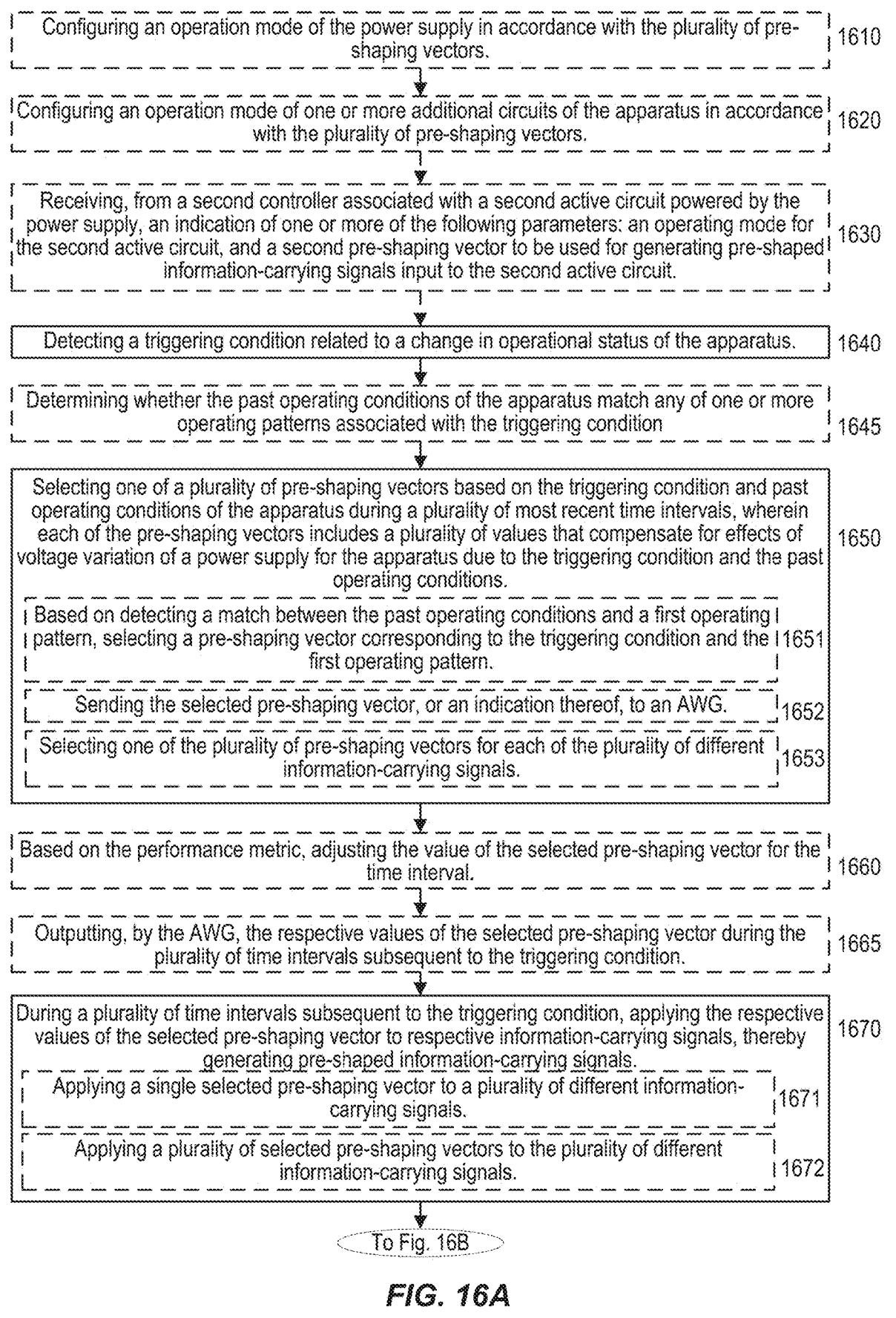

Configuring an operation mode of the power supply in accordance with the plurality of pre-shaping vectors.                                                                 1610

Configuring an operation mode of one or more additional circuits of the apparatus in accordance with the plurality of pre-shaping vectors.                                     1620

Receiving, from a second controller associated with a second active circuit powered by the power supply, an indication of one or more of the following parameters: an operating mode for the second active circuit, and a second pre-shaping vector to be used for generating pre-shaped information-carrying signals input to the second active circuit.                                             1630

Detecting a triggering condition related to a change in operational status of the apparatus.     1640

Determining whether the past operating conditions of the apparatus match any of one or more operating patterns associated with the triggering condition                          1645

Selecting one of a plurality of pre-shaping vectors based on the triggering condition and past operating conditions of the apparatus during a plurality of most recent time intervals, wherein each of the pre-shaping vectors includes a plurality of values that compensate for effects of voltage variation of a power supply for the apparatus due to the triggering condition and the past operating conditions.                                                                             1650

Based on detecting a match between the past operating conditions and a first operating pattern, selecting a pre-shaping vector corresponding to the triggering condition and the first operating pattern.     1651

Sending the selected pre-shaping vector, or an indication thereof, to an AWG.     1652

Selecting one of the plurality of pre-shaping vectors for each of the plurality of different information-carrying signals.     1653

Based on the performance metric, adjusting the value of the selected pre-shaping vector for the time interval.                                                                   1660

Outputting, by the AWG, the respective values of the selected pre-shaping vector during the plurality of time intervals subsequent to the triggering condition.                      1665

During a plurality of time intervals subsequent to the triggering condition, applying the respective values of the selected pre-shaping vector to respective information-carrying signals, thereby generating pre-shaped information-carrying signals.                                        1670

Applying a single selected pre-shaping vector to a plurality of different information-carrying signals.     1671

Applying a plurality of selected pre-shaping vectors to the plurality of different information-carrying signals.     1672

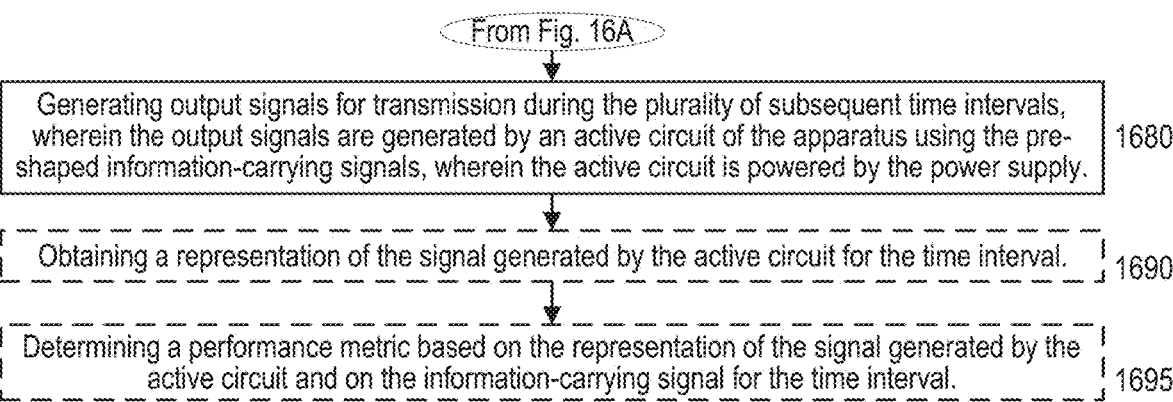

From Fig. 16A

Generating output signals for transmission during the plurality of subsequent time intervals, wherein the output signals are generated by an active circuit of the apparatus using the pre-shaped information-carrying signals, wherein the active circuit is powered by the power supply. | 1680

Obtaining a representation of the signal generated by the active circuit for the time interval. | 1690

Determining a performance metric based on the representation of the signal generated by the active circuit and on the information-carrying signal for the time interval. | 1695

FIG. 16B

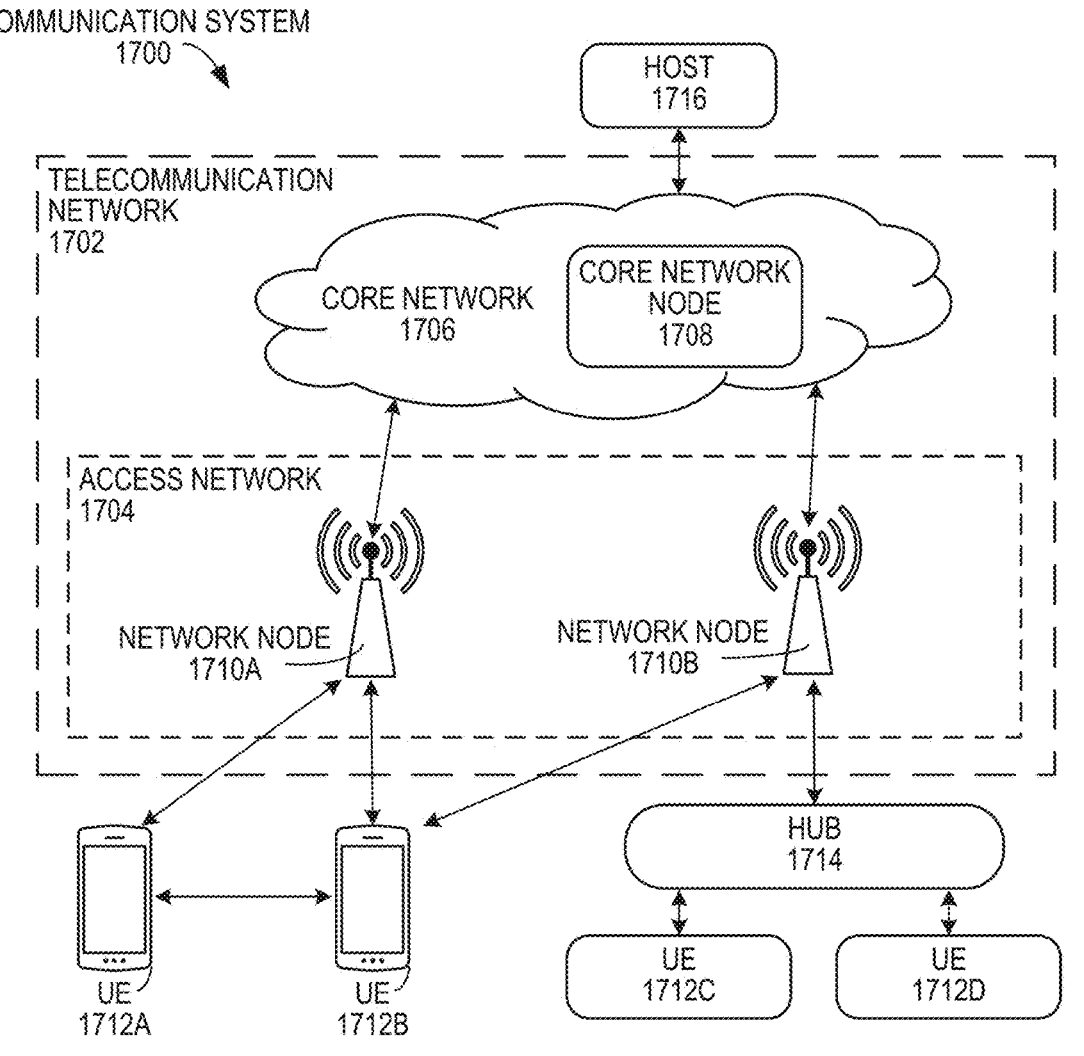

COMMUNICATION SYSTEM
1700

HOST
1716

TELECOMMUNICATION NETWORK
1702

CORE NETWORK
1706

CORE NETWORK NODE
1708

ACCESS NETWORK
1704

NETWORK NODE
1710A

NETWORK NODE
1710B

UE
1712A

UE
1712B

HUB
1714

SIGNAL PRE-SHAPING TO SUPPRESS POWER SUPPLY DISTURBANCES

TECHNICAL FIELD

The present disclosure relates generally to transmission and reception of signals, and more specifically to techniques for mitigating the effects of disturbances (or transients) in the power supplies of devices or circuits that transmit or receive signals.

BACKGROUND

Devices or circuits that transmit and/or receive analog signals are often powered by direct current (DC) voltages provided by power supplies. In many cases, a power supply derives its output DC voltage(s) from an input alternating current (AC) voltage, such as 120V or 240V from an electrical grid. However, a residual of the AC voltage may appear in the output DC voltage(s) in the form of a periodic variation, often referred to as "ripple voltage" or "ripple".

In a DC-powered device or circuit, ripple voltage may cause various unwanted effects such as extra beat, noise, signal distortion (e.g., by modulation of the analog signals), and/or improper operation. Ripple may be reduced or eliminated by placing filters or voltage regulators between the power supply DC output and the circuit DC input, but these components may also introduce extra cost and unwanted effects (e.g., heat, energy consumption).

In addition to the residual AC voltage, a power supply's DC output voltages may also vary due to changes in current drawn from the power supply. For example, if multiple circuits are drawing current from DC voltage(s) of the power supply and one of the circuits is switched off (or on), the current drawn from the power supply decreases (or increases). This can also be thought of as a change in load impedance seen by the power supply DC outputs. If the power supply has an output voltage $V_s$ and an output impedance $Z_s$, and the load impedance changes from $Z_L$ to $Z_L'$ due to switching circuits on or off, the power supply output voltage will change from $V_s*Z_L/(Z_L+Z_s)$ to $V_s*Z_L'/(Z_L'+Z_s)$.

However, regulated power supplies typically include output voltage regulators that attempt to maintain output voltages to within specified ranges. In effect, the power supply's output impedance $Z_s$ is regulated according to changes in load impedance. This is done by a regulation control loop having a specific loop bandwidth. The time-domain response of a regulated DC output voltage to a step change in load impedance depends on control loop filter, load characteristics, pre-charge, pre-discharge, and transfer characteristics of the power supply.

One type of device in which circuits are switched on and off is a Time Division Duplex (TDD) radio transceiver, which may switch between transmit and receive modes on a slot-by-slot basis. Turning off the transmitter while in receive mode improves the sensitivity of the receiver and reduces transceiver energy consumption (e.g., due to less current load). However, the increased current load when the transmitter is switched back on causes a disturbance in the power supply output voltage due to the change in load impedance. This disturbance in the power supply output voltage will manifest itself in an analog signal output by the transmitter of the TDD transceiver, for a duration determined by the time-domain response of the power supply (discussed above). Similarly, switching the transmitter off will cause a power supply disturbance that will manifest itself in the receiver's processing of an analog input signal. In effect, both disturbances may appear as undesired "modulation" in the gains of the analog signals.

SUMMARY

There are several conventional techniques for mitigating the effects of disturbances (or transients) in the power supplies of devices or circuits that transmit or receive analog signals, such as TDD radio transceivers. However, these techniques reduce but do not remove the effects of these disturbances. Thus, there is a need for techniques to remove these residual effects, particularly for disturbances such as TDD transmit/receive switching that is predictable and/or occurs regularly.

An object of embodiments of the present disclosure is to remove unwanted modulation of transceiver gain and/or phase due to regular or predictable power supply disturbances, such as by providing, enabling, and/or facilitating solutions to overcome exemplary problems summarized above and described in more detail below.

Embodiments include methods (e.g., procedures) for an apparatus configured to generate output signals for transmission. For example, the apparatus can be, or be part of, a radio access network (RAN) node or a user equipment (UE).

These exemplary methods include detecting a triggering condition related to a change in operational status of the apparatus and selecting one of a plurality of pre-shaping vectors based on the triggering condition and past operating conditions of the apparatus during a plurality of most recent time intervals. Each of the pre-shaping vectors includes a plurality of values that compensate for effects of voltage variation of a power supply for the apparatus due to the triggering condition and the past operating conditions.

These exemplary methods include, during a plurality of time intervals subsequent to the triggering condition, applying the respective values of the selected pre-shaping vector to respective information-carrying signals, thereby generating pre-shaped information-carrying signals. These exemplary methods include generating output signals for transmission during the plurality of subsequent time intervals. The output signals are generated by an active circuit of the apparatus using the pre-shaped information-carrying signals. The active circuit is powered by the power supply.

Other embodiments can include an apparatus configured to generate output signals for transmission. The apparatus can include a pre-shaping controller configured to detect a triggering condition related to a change in operational status of the apparatus, and to select one of a plurality of pre-shaping vectors based on the triggering condition and past operating conditions of the apparatus during a plurality of most recent time intervals. Each of the pre-shaping vectors includes a plurality of values that compensate for effects of voltage variation of a power supply for the apparatus due to the triggering condition and the past operating conditions.

The apparatus also includes a signal multiplier configured to, responsive to the pre-shaping controller, apply the respective values of the selected pre-shaping vector to respective information-carrying signals during a plurality of time intervals subsequent to the triggering condition, thereby generating pre-shaped information-carrying signals. The apparatus also includes an active circuit powered by the power supply and configured to generate output signals for transmission during the plurality of subsequent time intervals using the pre-shaped information-carrying signals.

In some embodiments, the apparatus also includes one or more transmitter circuit branches and one or more receiver circuit branches. In some embodiments, the apparatus also includes an arbitrary waveform generator (AWG) configured to receive the selected pre-shaping vector, or an indication thereof, from the pre-shaping controller and to output the respective values of the selected pre-shaping vector during the plurality of time intervals subsequent to the triggering condition.

In some embodiments, the apparatus also includes a transmitter observation receiver configured to obtaining a representation of the signal generated by the active circuit during each time interval of the plurality of subsequent time intervals, and a divider circuit configured to generate a complex error signal from inputs of the representation of the signal generated by the active circuit and a delayed version of the information-carrying signal for the time interval. In such embodiments, the pre-shaping controller is further configured to adjust the value of the selected pre-shaping vector for the time interval via multiplication by the inverse of the complex error signal.

Other embodiments include non-transitory, computer-readable media storing program instructions that, when executed by a pre-shaping controller of an apparatus configured to generate output signals for transmission, configure the apparatus to perform operations corresponding to any of the exemplary methods described herein.

These and other embodiments described herein can provide various benefits and/or advantages. In contrast to conventional techniques, embodiments of the present disclosure can completely remove any predictable effects of disturbances in power supplies of devices or circuits that transmit or receive analog signals, such as TDD radio transceivers. Moreover, performance degradation due to effects of power supply disturbances (or transients) are often discovered at late stages of product development testing when hardware redesign has great impact on cost and/or time-to-market (TTM). By using programmable techniques, embodiments can mitigate effects of power supply disturbances on system performance without need for expensive and time-consuming hardware redesign. Furthermore, embodiments can provide the flexibility to tune pre-shaping for each individual device (e.g., transceiver) before and/or after deployment.

These and other objects, features, and advantages of embodiments of the present disclosure will become apparent upon reading the following Detailed Description in view of the Drawings briefly described below.

BRIEF DESCRIPTION OF THE DRAWINGS

FIG. 5 shows a table of N=34 conditions corresponding to respective pre-shaping signal vectors, according to some embodiments of the present disclosure.

FIGS. 16A-B show a flow diagram of an exemplary method (e.g., procedure) for an apparatus configured to generate output signals for transmission, according to various embodiments of the present disclosure.

FIG. 17 shows an example of a communication system in in which some embodiments of the present disclosure may be utilized.

DETAILED DESCRIPTION

Some of the embodiments contemplated herein will now be described more fully with Embodiments briefly summarized above will now be described more fully with reference to the accompanying drawings. These descriptions are provided by way of example to explain the subject matter to those skilled in the art and should not be construed as limiting the scope of the subject matter to only the embodiments described herein. More specifically, examples are provided below that illustrate the operation of various embodiments according to the advantages discussed above.

In general, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The operations of any methods and/or procedures disclosed herein do not have to be performed in the exact order disclosed, unless an operation is explicitly described as following or preceding another operation and/or where it is implicit that an operation must follow or precede another operation. Any feature of any embodiment disclosed herein can apply to any other disclosed embodiment, as appropriate. Likewise, any advantage of any embodiment described herein can apply to any other disclosed embodiment, as appropriate.

As briefly mentioned above, one type of device in which circuits are switched on and off is a Time Division Duplex (TDD) radio transceiver, which may switch between transmit and receive modes on a slot-by-slot basis. Turning off the transmitter while in receive mode improves the sensitivity of the receiver and reduces transceiver energy consumption (e.g., due to less current load). However, the increased current load when the transmitter is switched back on causes a disturbance in the power supply output voltage due to the change in load impedance. This disturbance in the power supply output voltage will manifest itself in an analog signal output by the transmitter of the TDD transceiver, for a duration determined by the time-domain response of the power supply (discussed above).

Figure 1:
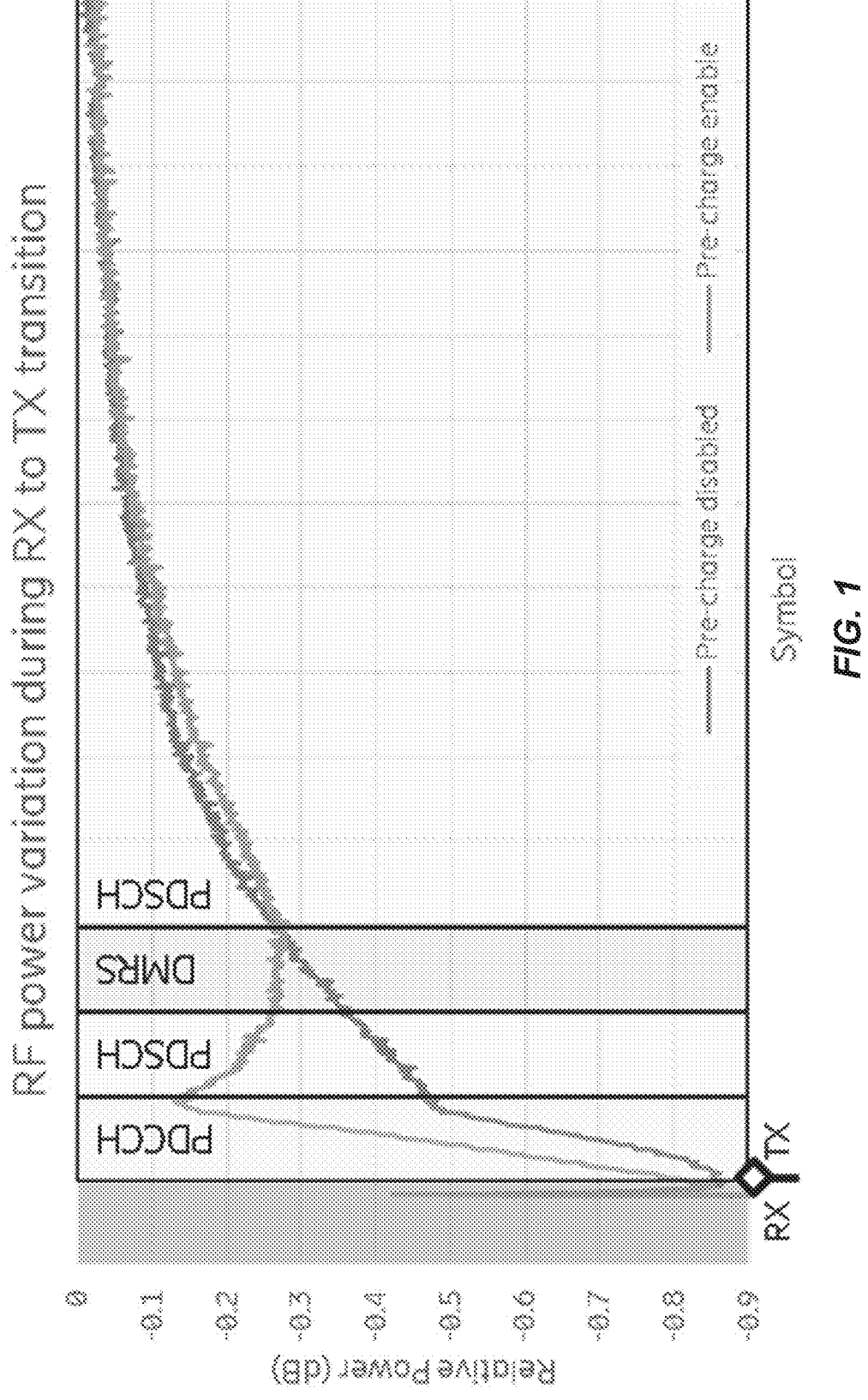
FIG. 1 shows an example of power variation in a signal output by a TDD transceiver, due to power supply disturbance when switching from receive (RX) to transmit (TX).

FIG. 1 shows an example of power variation in a signal output by a TDD transceiver, due to power supply disturbance when switching from receive (RX) to transmit (TX). The horizontal axis shows time in terms of symbols during a timeslot, while the vertical axis shows actual output power (dB) relative to an expected output power (i.e., 0 dB). The two lines correspond to respective conditions in which power supply pre-charge is enabled and disabled.

Figure 2:
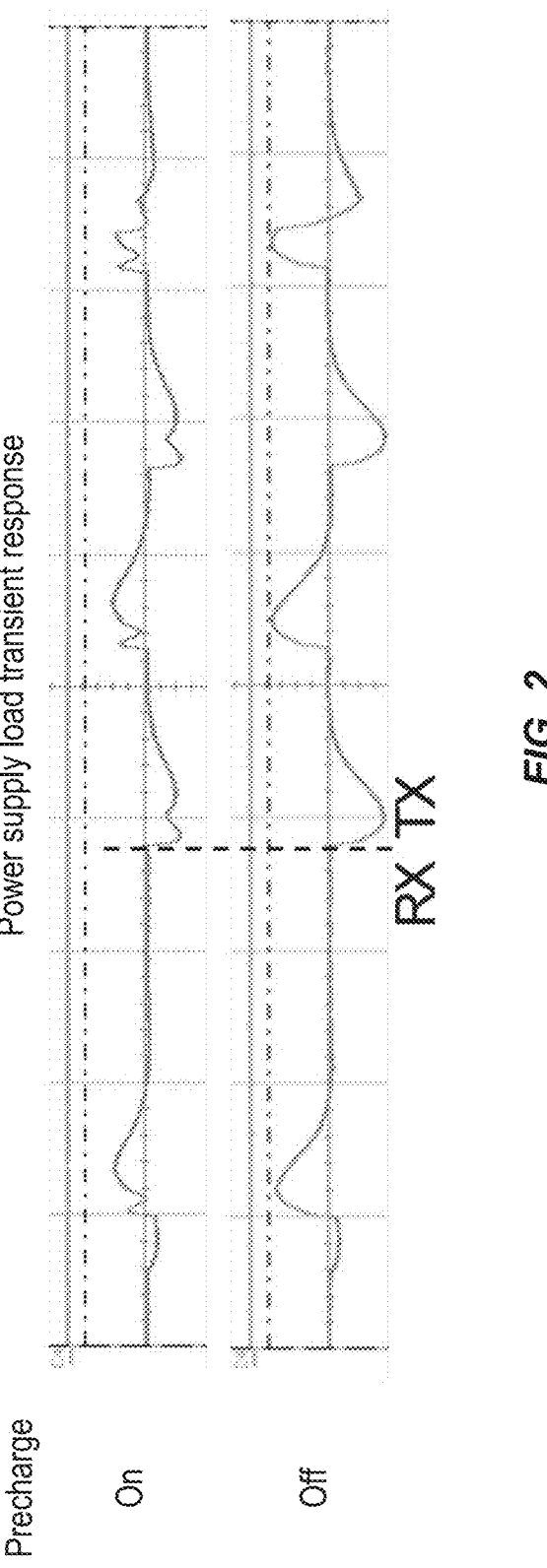
FIG. 2 shows an example transient response of the power supply output voltage corresponding to the conditions shown in FIG. 1.

The output power variation illustrated in FIG. 1 is caused by output voltage change on the power supply for the transceiver, due to the sudden change in load current when the transmitter resumes from the low power mode. FIG. 2 shows an example transient response of the power supply output voltage corresponding to the conditions shown in FIG. 1. As can be seen in FIG. 2, the power supply output voltage drops immediately after the RX-TX switch and recovers over some period. This drop and recovery corresponds to the period in FIG. 1 when the actual output power of the transmitted signal is less than the expected output power.

Note that demodulation reference signals (DMRS) are transmitted in the third symbol after RX-TX switch in FIG. 1. DMRS contain known symbols and are used by a receiving entity (e.g., user equipment (UE) or base station) to estimate the radio channel from the transmitter. This estimate is then used to facilitate demodulation of data transmitted over the same radio channel. The example timeslot shown in FIG. 1 is transmitted in the downlink (DL) by a base station, with the DMRS in the third symbol being used by UEs to facilitate demodulation of data carried by physical DL shared channel (PDSCH) in symbols on either side of the DMRS symbol.

In effect, the reduction in output power for the DMRS symbol will cause the UE to estimate a radio channel that is more attenuated than the actual channel. Furthermore, due to the differences in output power between the DMRS symbol and the respective PDSCH symbols, the UE's radio channel amplitude estimate based on DMRS is inaccurate when used for demodulating data carried by the PDSCH symbols.

Another possible effect is on the phase of the transmitted signal. For example, the power supply variations shown in FIG. 1 may cause deviations in phase and/or frequency between the DMRS symbol and the respective PDSCH symbols. This is due to effects of the power supply on a local oscillator (LO) used by the transmitter. In such case, the UE's radio channel phase estimate based on DMRS is inaccurate when used for demodulating data carried by the PDSCH symbols.

These effects may manifest themselves in the center of the data symbol constellations being offset from the nominal (or expected) zero value, which can increase the probability of a data symbol decision error. Even if a data symbol decision error is detected by a cyclic redundancy check (CRC) in the UE receiver, it will cause the UE to send the base station a negative acknowledgement (NACK) for the transport block (TB) for which the error is detected. Repeated NACKs indicating an elevated block error rate (BLER) can cause the base station to increase the robustness of the modulation and coding scheme (MCS) used for the PDSCH, which also reduces the data throughput.

Figure 3:
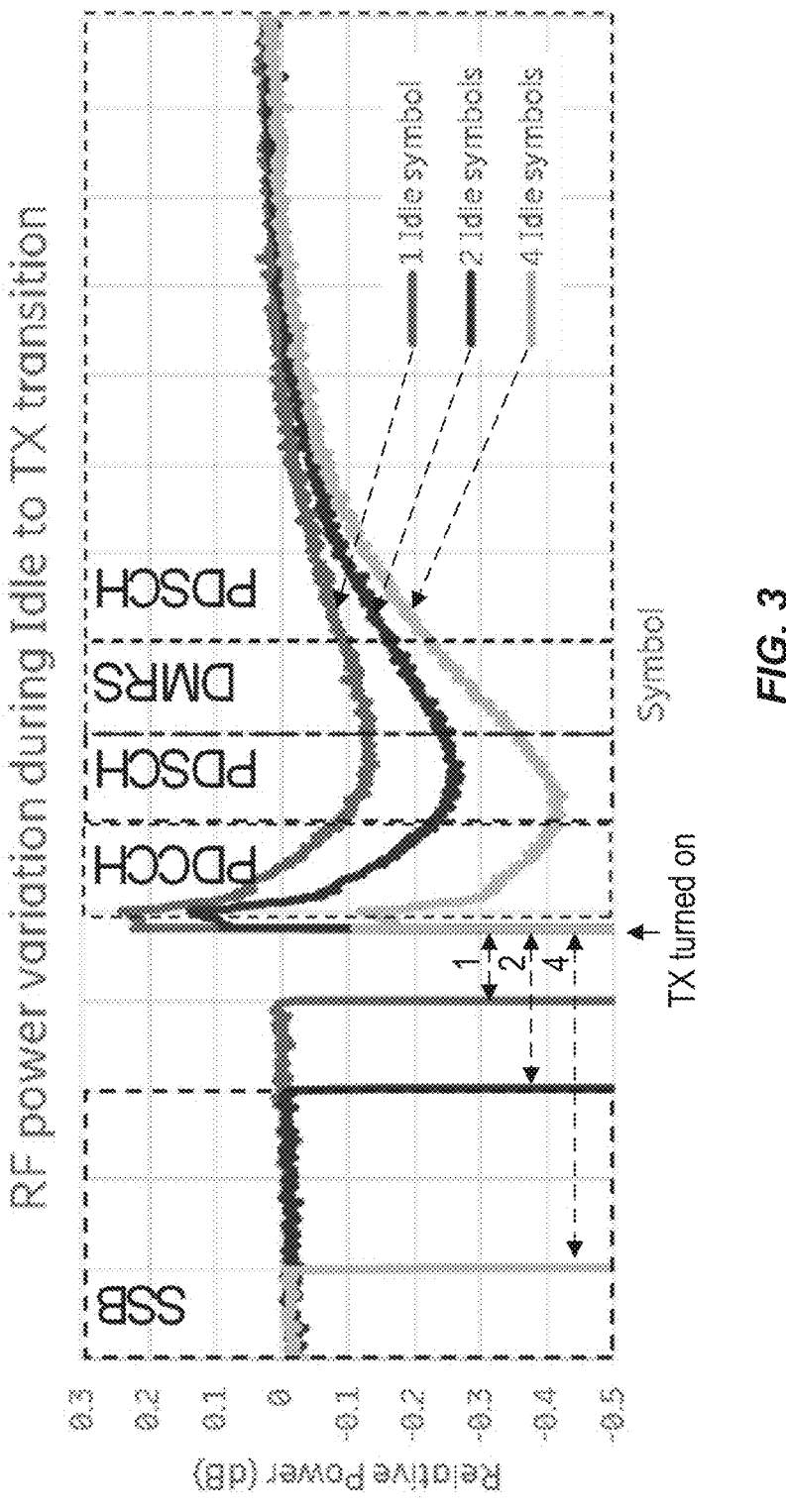
FIG. 3 shows another example of power variation in a signal output by a TDD transceiver, due to power supply disturbance when switching from RX to TX.

Furthermore, the output power variation due to RX-TX switching can also be dependent on how long the TX has been switched off. FIG. 3 shows another example of power variation in a signal output by a TDD transceiver, due to power supply disturbance when switching from RX to TX. The horizontal axis shows time in terms of symbols during a timeslot, while the vertical axis shows actual output power (dB) relative to an expected output power (i.e., 0 dB). The three lines correspond to three different "off" durations of 1, 2, and 4 symbols. The TX signal output power in the symbols after the TX is turned on suffers a greater reduction and a longer transient period as the "off" duration increases.

Although problems described above relate to switching a transmitter on, switching the transmitter off will cause similar power supply disturbances (i.e., sudden decrease in load current) that will manifest itself in a receiver's processing of an analog input signal. For example, power supply output voltage disturbances may appear as undesired "modulation" in gains and/or phases of received signals. This can also lead to data symbol detection errors.

Accordingly, embodiments address these and related problems, issues, and/or difficulties by removing undesired but predictable modulation of a transceiver's transfer function by multiplying (or modulating) the nominal (or desired) transmit signal with an additional pre-shaping signal that corresponds to the inverse of the undesired modulation. If the pre-shaping signal is exactly inverse and if the unwanted modulation operation is linear, the unwanted modulation is eliminated. In cases where only the signal amplitude needs to be pre-shaped, real-valued pre-shaping can be implemented by a digital multiplier, a variable gain amplifier (VGA), a mixer, etc. In cases where signal phase and amplitude need to be pre-shaped, complex-valued pre-shaping can be implemented by an arbitrary waveform generator coupled to a controller. For example, the controller can be used to control operation modes, select pre-shape model from memory, configure the arbitrary waveform generator with the model, and initiate the arbitrary waveform generator at the right time.

At a high level, apparatus embodiments can include an arbitrary waveform generator (AWG), storage containing models of a pre-shaped signal, and a modulator that applies the output of the AWG to the nominal (or desired) signal. Both the AWG and the modulator can be implemented in software, hardware, or a combination thereof. An essential function is the ability to predict unwanted modulation of the information carrying signal due to changed operation modes or changed average signal characteristics in a (fairly) linear active circuit. The inventive step is to modulate the input signal to the active circuit to cancel out gain or phase modulation in a (fairly) linear active circuit that is not due to the signal envelope itself.

In contrast to conventional "pre-distortion" techniques where a data-carrying signal is pre-compensated to mitigate effects of circuit (e.g., power amplifier) non-linearities on the signal, embodiments apply pre-shaping that depends, or is based, on a different signal than the data-carrying signal. For example, embodiments depend on amplitude modulation present in the power supply input to the transceiver, which can manifest as amplitude and/or phase modulation in the desired signal due to effects on the transceiver components (e.g., power amplifier, LO, etc.). Moreover, embodiments do not require linearization as done in conventional "pre-distortion" techniques. Similarly, in contrast to conventional "pre-emphasis" techniques, embodiments do not provide frequency selective processing of the data-carrying signal.

Embodiments can provide various benefits and/or advantages. For example, conventional techniques reduce but do not completely remove the effects of disturbances (or transients) in the power supplies of devices or circuits that transmit or receive analog signals, such as TDD radio transceivers. In contrast, embodiments of the present disclosure can completely remove any predictable effects of power supply disturbances. Thus, embodiments are advantageous when used instead of—or even in conjunction with—conventional analog techniques.

Moreover, performance degradation due to effects of power supply disturbances (or transients) are often discovered at late stages of product development testing when hardware redesign has great impact on cost and/or time-to-market (TTM). By using programmable techniques, embodiments can mitigate effects of power supply disturbances on system performance without need for expensive and time-consuming hardware redesign.

Furthermore, embodiments can provide the flexibility to tune pre-shaping for each individual device (e.g., transceiver) before and/or after deployment. For example, transceiver BLER (or NACK) statistics can be monitored and when they reach an unacceptable level, the pre-shaping can be adjusted based on selecting new parameters and/or models. Alternately, a receiver used for transmitter observation during linearization and/or power regulation may also provide feedback that can be used for pre-shaping adjustment.

Also, by providing a means to suppress power supply disturbances, embodiments can facilitate design choices that reduce cost and/or complexity but result in greater effects on transmitted (or received) signals, including increased power supply ripple, reduced rejection of power supply ripple, etc.

Figure 4:
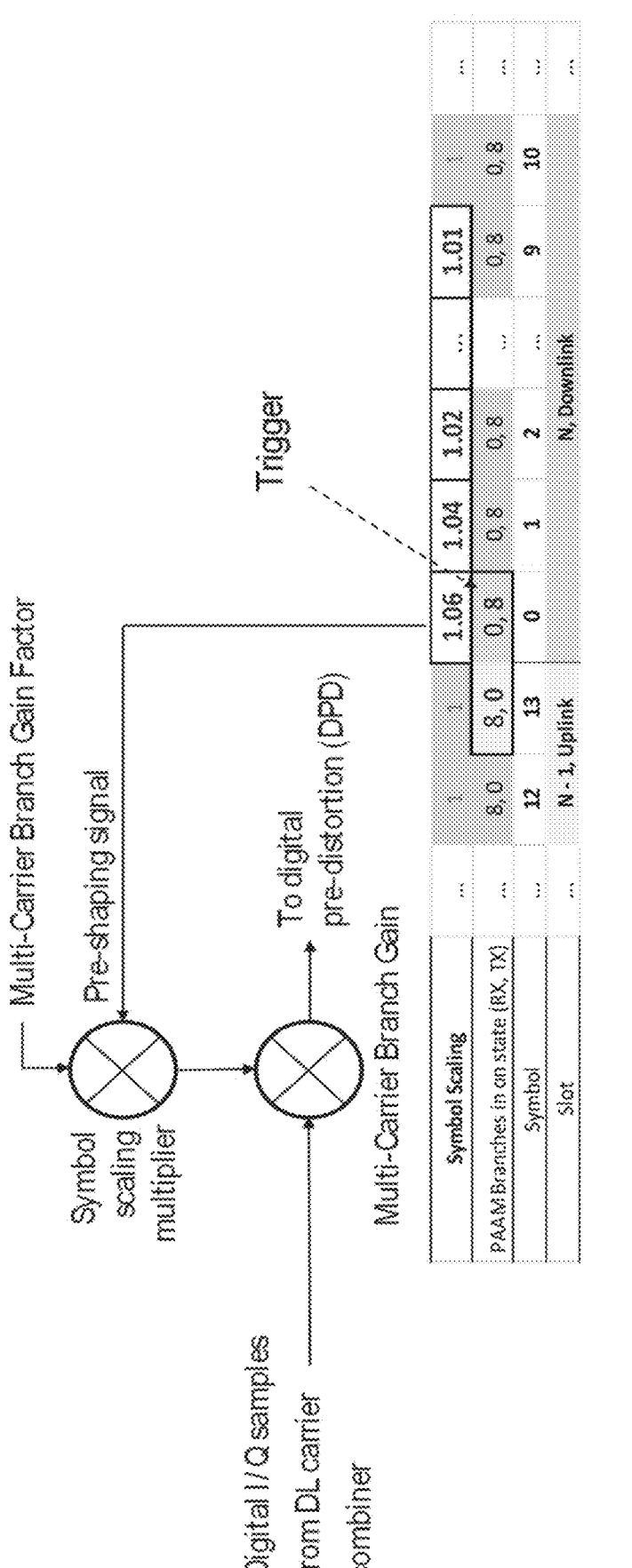
FIG. 4 shows a power transient pre-shaping (PTPS) arrangement according to some embodiments of the present disclosure.

In the following description, various embodiments of these techniques may be referred to as power transient pre-shaping (PTPS). FIG. 4 shows a PTPS arrangement (e.g., apparatus) according to some embodiments of the present disclosure. In this arrangement, digital in-phase and quadrature (I/Q) samples from a DL carrier combiner unit are input to an amplifier that applies a multi-carrier branch gain and outputs the resulting signal to a digital pre-distortion (DPD) unit. For example, the DPD may apply pre-distortion to the signal to mitigate non-linear distortion introduced by a power amplifier (PA) that follows the DPD. The digital I/Q samples may be associated with multiple carriers that are transmitted by a single PA.

As an implementation example, in a phased array antenna module (PAAM), the transmitter circuitry can be divided into smaller segments (or branches), with the different branches being powered up or down depending on the desired antenna gain and number of data layers. The circuitry shown in FIG. 4 may be associated with a single branch of a PAAM.

Conventionally, the digital I/Q samples are scaled (e.g., amplified or attenuated) directly by a multi-carrier branch gain, which may be relatively fixed or constant for each branch (e.g., "semi-constant"). In embodiments of the present disclosure, a symbol scaling multiplier is introduced, with inputs of the multi-carrier branch gain factor and a pre-shaping signal and an output that is applied to the digital I/Q samples as the multi-carrier branch gain.

The pre-shaping signal is generated by an arbitrary waveform generator (AWG), which can be implemented in a field programmable gate array (FPGA) according to some variants. The AWG generates a gain factor that varies per symbol based on time of power supply load change (e.g., due to RX-TX switch), magnitude of power supply load change, and duration of TX idle period prior to the power supply load change (e.g., number of symbols). In the example shown in FIG. 4, the AWG generates non-unity values (e.g., >1) for the first M=10 symbols after the load change but unity values otherwise.

More generally, N different M-symbol waveforms can be stored in a memory accessible by the AWG, with example values N=34 and M=10. Each waveform can be selected based on a different combination of load change magnitude and duration of pre-change idle period. In general, N can be determined based on how many different combinations can or need to be improved by these techniques. The AWG generates a selected waveform during 10 symbols after a trigger condition is satisfied. The triggering of the AWG is performed by a controller (or timing unit) that is aware of symbol timing and symbol power state in each multi-carrier branch (e.g., PAAM segment).

In the example shown in FIG. 4, the trigger condition is a symbol-to-symbol change in the number of TX branches in "on" mode from 0 to 8, which occurs between symbol 13 and 0 (i.e., of next timeslot).

FIG. 5 shows a table of N=34 conditions corresponding to respective pre-shaping signal vectors, according to some embodiments of the present disclosure. Vector indices are in the far right column with the adjacent column having the respective trigger conditions associated with each vector. The five left-most columns indicate required past conditions in respective five symbols immediately preceding the trigger (e.g., how many branches are in RX on and/or TX on state). The table uses the following nomenclature:

"0,0" indicates zero branches in RX on state and zero branches in TX on state;

"x" means any number (or don't care);

">=pbt" (or ">=pbr") indicates greater than or equal to pbt (or pbr) branches in TX on (or RX on) state, where "pbr" and "pbt" are thresholds for number of branches, allowing to differentiate based on degree of power load change;

Empty cell indicates no condition (or don't care); and

">0" (without more) indicates sum of TX and RX branches in on state is non-zero.

When one of the trigger conditions in the second-right column is satisfied, the controller determines the past conditions for the most recent 5 symbols and searches the table for a row where the five left-most entries meet those past conditions. If the controller identifies a matching row associated with a vector index, the controller causes the AWG to use the 10-symbol vector (not shown in FIG. 5) identified by that vector index. In particular, the AWG outputs the vector as a 10-symbol pre-shaping signal, which is applied as shown in FIG. 4. If the controller does not identify a matching row, it causes the AWG to continue outputting unity gain.

Figure 6:
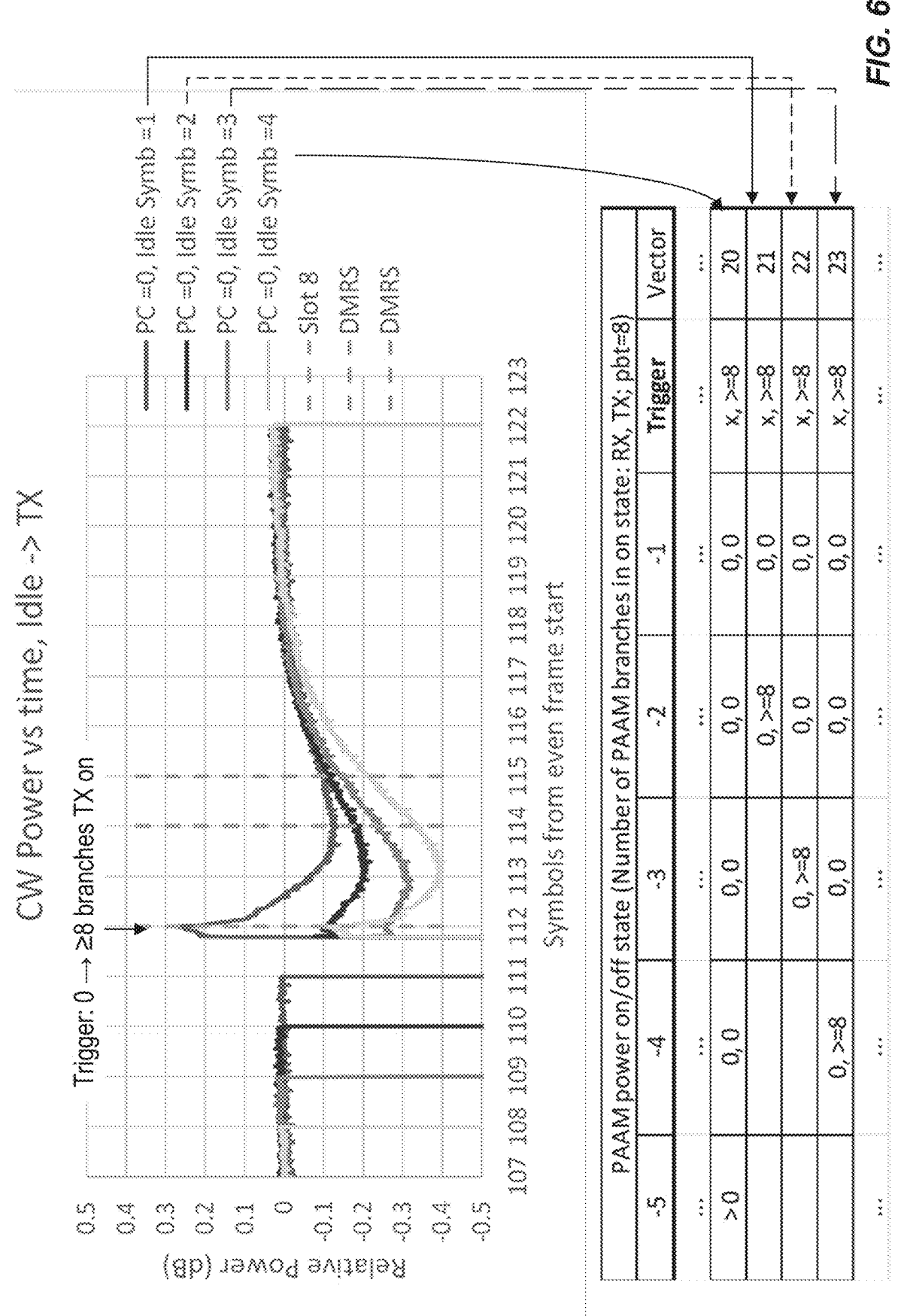
FIG. 6 illustrates how the table shown in FIG. 5 can be applied in some embodiments.

FIG. 6 illustrates how the table shown in FIG. 5 can be applied in some embodiments. In this arrangement, the triggering condition is the number of TX branches in TX on state changes from zero to greater than or equal to pbt=8, with the number of RX branches in on state being irrelevant. When this triggering condition is met, the controller looks for a match between the past conditions for the most recent 5 symbols and one of the table rows associated with the triggering condition. In this example, the controller identifies whether RX and TX were in off state for 1, 2, 3, or >4 most recent symbols, which respectively correspond to rows 21-23 and 20 of the table. The controller selects a matching row based on number of consecutive RX/TX off symbols and causes the AWG to use the 10-symbol vector (not shown in FIG. 5) identified by that vector index (or row).

In the example shown in FIG. 6, the per-symbol values in the vector used by the AWG will be approximately inverse of the per-symbol relative powers shown in the figure. In other words, if relative power for a symbol is X dB, where X>0, the pre-shaping gain for that symbol will be −X dB, such that the resulting symbol power level to the DPD will be X−X=0 dB (i.e., 1.0).

Figure 7A:
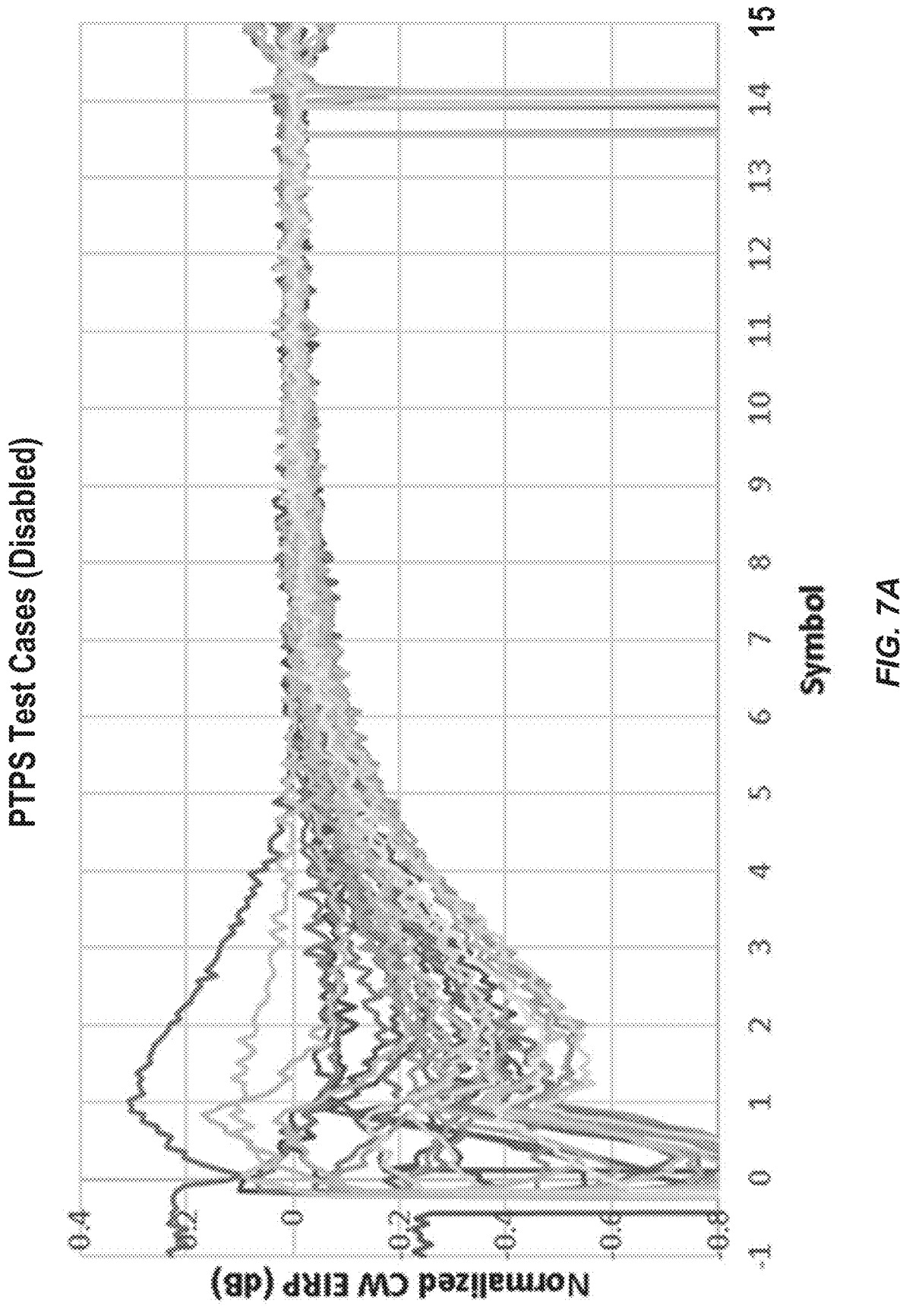
FIGS. 7A-B show a performance comparison for the conditions corresponding to entries of the table shown in FIG. 5.
Figure 7B:
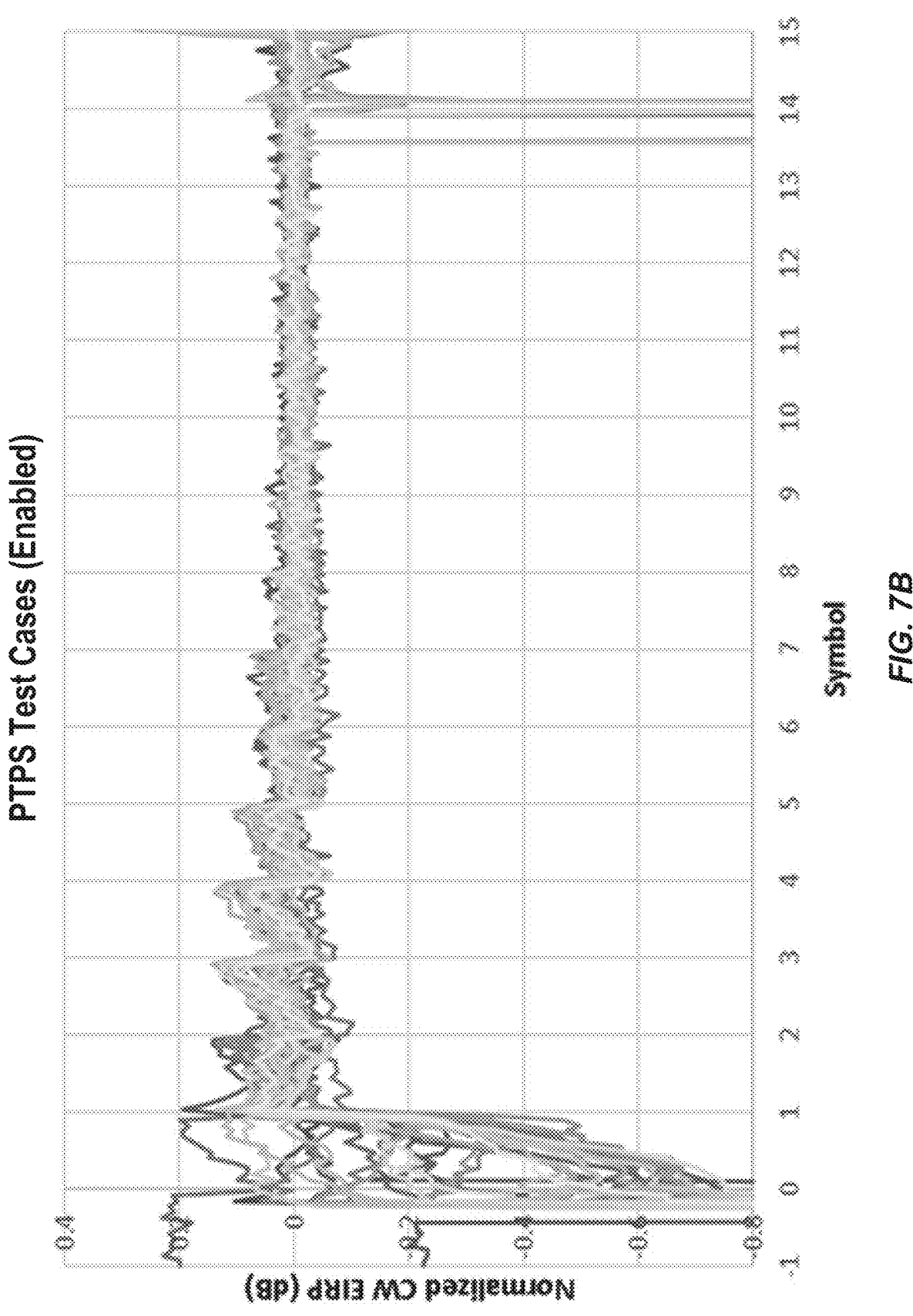

FIGS. 7A-B show a performance comparison for the conditions corresponding to the N=34 rows in FIG. 5. In particular, FIG. 7A shows normalized power level during the 14 symbols after the triggering condition and the past conditions in the preceding 5 symbols, without application of pre-shaping gain, while FIG. 7B shows corresponding normalized power level with application of pre-shaping gain. In general, applying condition-dependent pre-shaping gain causes the normalized power level to reach a relatively steady state (e.g., within +/−0.2 dB) multiple symbols before the same conditions without applying pre-shaping gain.

Figure 8:
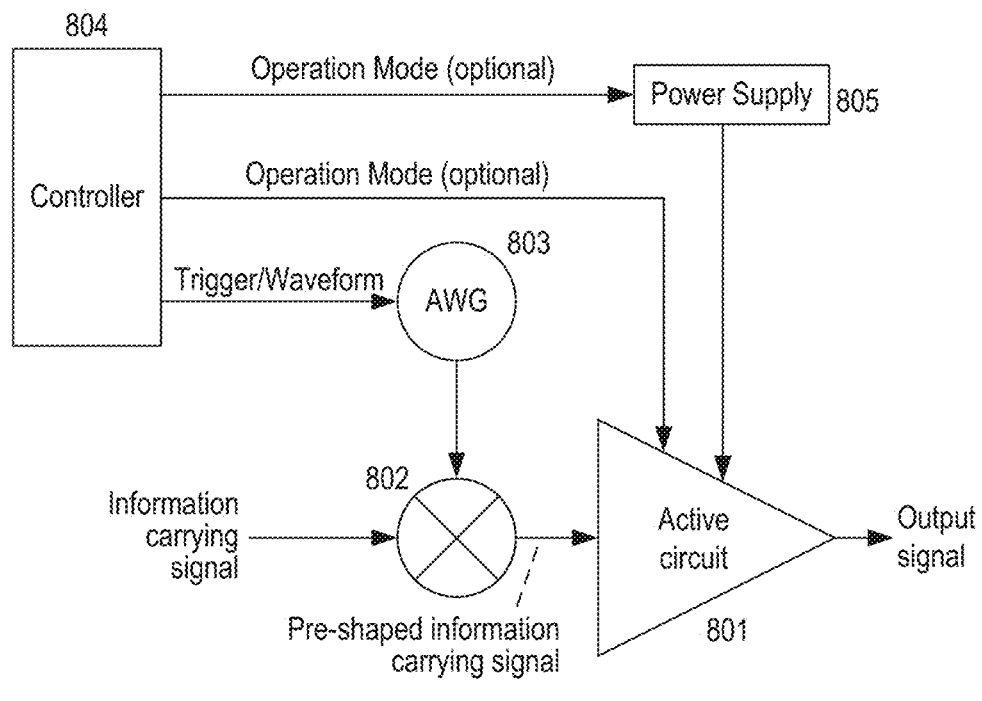
FIGS. 8-15 show block diagrams of different apparatuses according to various embodiments of the present disclosure.

FIG. 8 shows an apparatus that employs PTPS according to some embodiments of the present disclosure. In this apparatus, an information-carrying signal is applied to one input of a multiplier or gain function (802), with the output of the multiplier being an input to an active circuit (801). In particular, the active circuit's operation mode and/or average properties of the input signal affect the amount of current that the active circuit draws from a power supply (805). Furthermore, the transfer function (e.g., gain, phase) of the active circuit is dependent on the voltage provided by the power supply voltage but not significantly dependent on the envelope (or amplitude) of the input signal. The active circuit may be any type of active device, such as a mixer, analog-to-digital converter (ADC), digital-to-analog converter (DAC), amplifier, or a combination thereof.

Although not shown, decoupling capacitors can be used to efficiently suppress the effects of high-frequency variations in power supply current and/or voltage on the transfer function of the active circuit. Thus, any remaining variations in power supply current and/or voltage will be relatively low frequency.

The apparatus in FIG. 8 also includes a controller (804), which provides a trigger and waveform indication to an arbitrary wave form generator (AWG, 803). Based on the inputs, the AWG generates a pre-shaping signal that is also input to the multiplier. Due to mitigation of high-frequency power supply effects, a relatively low bandwidth is required of the pre-shaping signal.

The controller has information about average properties of the information-carrying signal, operational modes of the active circuit and the power supply, and the influence of these on the transfer function of the active circuit. The controller configures the AWG with a pre-shaping signal model, such as a set of N different M-symbol waveforms (or vectors). Each waveform indication from the controller causes the AWG to select the corresponding waveform and start outputting it as triggered by the controller. For example, the AWG may output a single sample of the waveform per symbol, with that sample being applied to the multiplier for the duration of the symbol. Other arrangements are also possible according to desired implementations.

The multiplier applies the pre-shaping signal output by the AWG to the information carrying signal to generate a pre-shaped information carrying signal, which is input to the active circuit. For example, the multiplier applies one sample of the pre-shaping signal to each symbol of the information carrying signal. The active circuit generates an output signal based on the pre-shaped information carrying signal, according to the transfer function of the active circuit.

In some embodiments, the controller can also provide operation mode signals to the power supply and/or the active circuit. For example, the operation mode signal to the power supply can indicate pre-charge on/off, pre-discharge on/off, or other functions that can reduce voltage variation during load transients. As another example, the operation mode signal to the active circuit can indicate pre-shaping should be turned on/off, performed for all or a subset of symbols, performed for all or a subset of information-carrying signals, performed for all or a subset of information signal average properties, etc.

The dependency of the operation mode and signal average properties is given by the transfer function (f) of the active circuit. After the transfer function f is characterized, the inverse is determined and loaded into the AWG. For optional results, the transfer function f should not vary significantly with respect to the envelope (or amplitude) of the input signal (i.e., multiplier output). As an example, the active circuit should be able to reproduce pre-shaped information carrying signal at its output without significant non-linear distortion. Otherwise, significant non-linearity may inhibit or suppress the pre-shaping effects.

Figure 9:
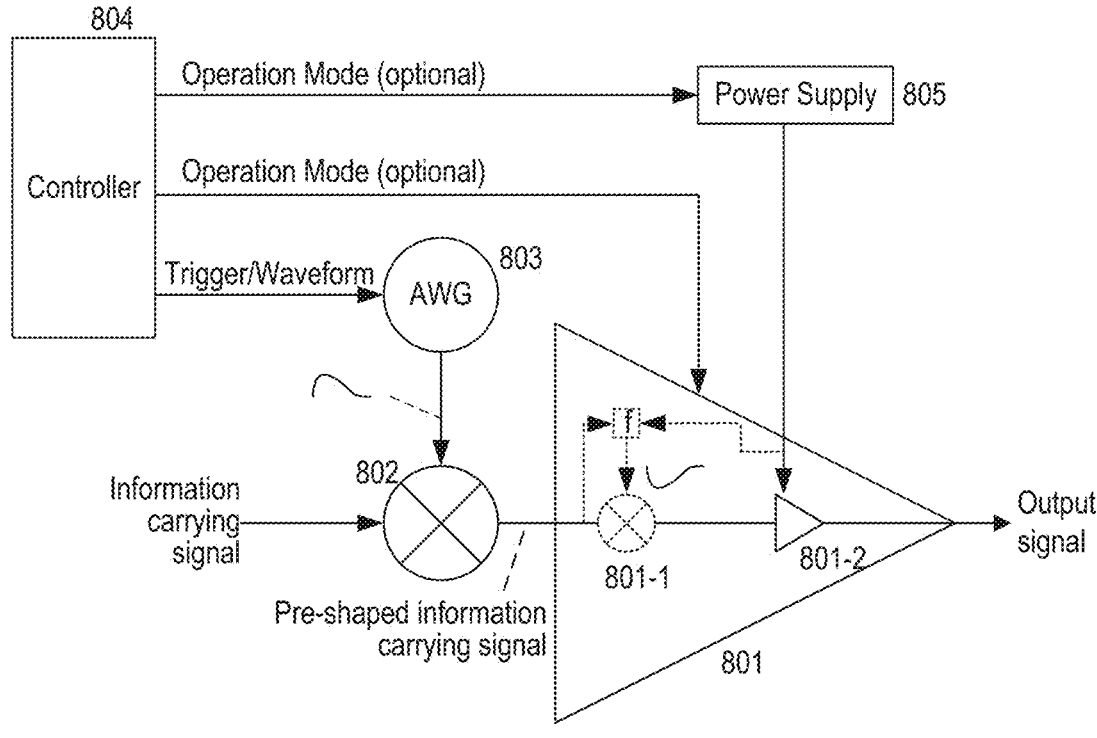

This effect is illustrated by FIG. 9, which shows the same apparatus as FIG. 8 with some additional details of the active circuit internals. If the active circuit is sufficiently linear, the dependency of operation mode and signal properties can be represented by a virtual multiplier (801-1) at the input of a mode-independent version of the circuit. In FIG. 9, the active circuit's transfer function (f) is characterized as a time-varying gain, represented by the curved line input to the multiplier preceding a physical amplifier (801-2) of the active circuit. The inverse of the transfer function (f) is shown as another time-varying gain output by the AWG.

Figure 10:
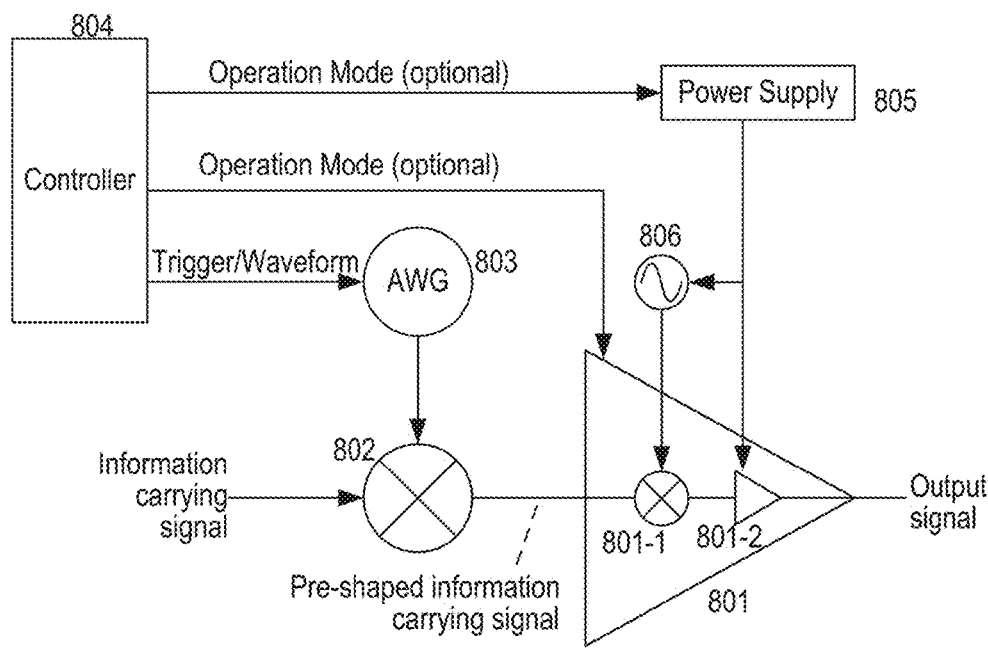

In some embodiments, the output of AWG may be complex, allowing both amplitude and phase to be pre-shaped according to a selected vector. For example, pre-shaping phase may suppress phase variations caused by ramping bias or frequency pulling/pushing in a LO due to power supply variations. FIG. 10 shows an exemplary apparatus according to these embodiments. This apparatus includes the same components as FIGS. 8-9, with the addition of a LO (806). Additionally, the active circuit includes a mixer (801-1) and an amplifier (801-2). The mixer receives an input signal from the LO and uses it to change the center frequency of the input signal to the active circuit. Variations of the power supply voltage will result in phase and/or frequency disturbances in the LO output, which causes disturbances in the mixer output signal. These can be compensated for in the complex pre-shaping signal generated by the AWG.

In various embodiments, the multipliers used to apply the pre-shaping signal may be implemented in a digital domain or in an analog domain. In the analog case, a non-complex multiplier can be realized by a programmed gain amplifier (PGA), a voltage controlled variable gain amplifier (VCVGA), or similar circuits. In the VCVGA case, a DAC is required to convert the AWG signal to a voltage.

In some embodiments, the controller can monitor the performance of the pre-shaping based on feedback from a transmitter observation receiver or NACK/BLER statistics from a baseband processor. Based on this information, the controller can revise the existing pre-shaping signal models and provide the revised models to the AWG. In a multi-branch transmitter system, these operations can be performed for all branches or individually for each branch.

Figure 11:
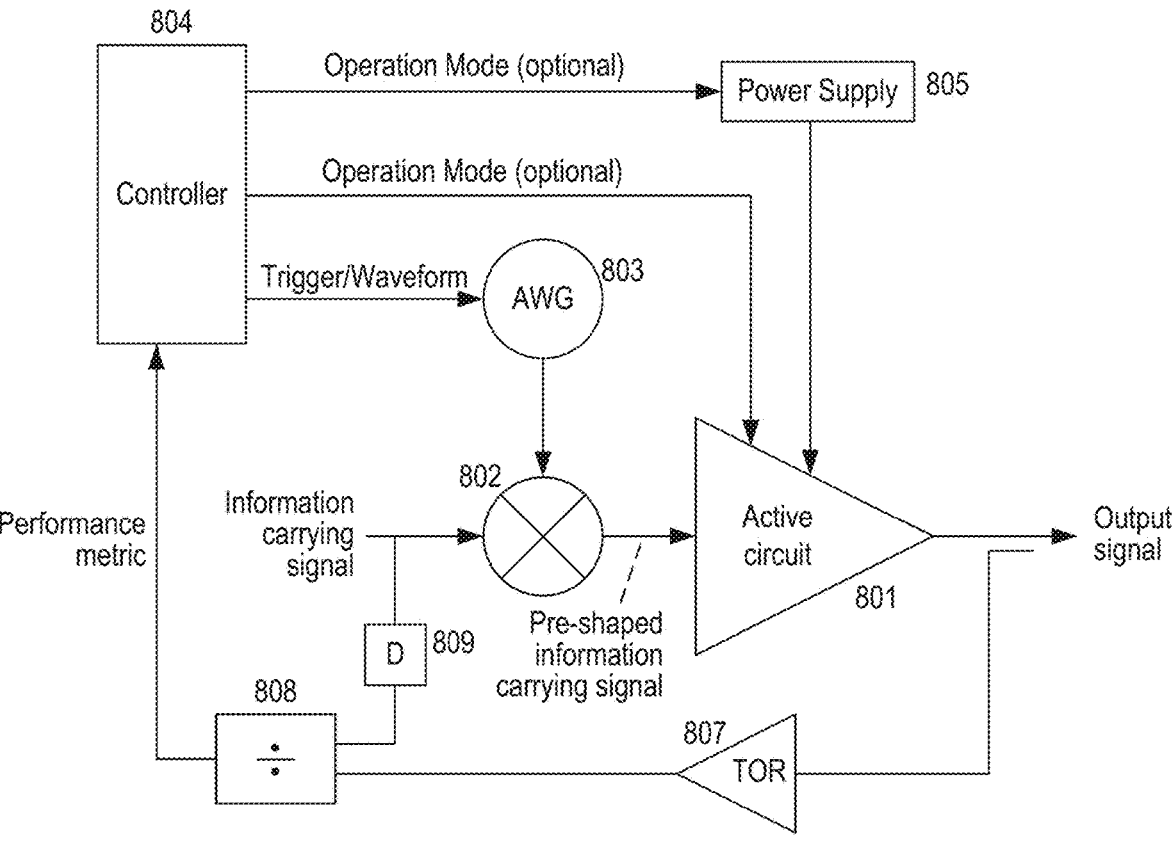

FIG. 11 shows an exemplary apparatus that employs self-learning using local feedback, according to these embodiments. This apparatus includes the same components as FIGS. 8-9, with the addition of a transmitter observation receiver (TOR, 807), a divider circuit (808), and a delay circuit (809). The TOR performs the inverse operation of the active circuit (801), which may include frequency conversion, gain, and phase shift. After being delayed by the delay circuit, the information carrying signal is input to the divider circuit, which produces a performance metric (e.g., error vector) based on division of the TOR's output with the delayed information carrying signal. The delay circuit may be configured to delay the information carrying signal by an amount corresponding to the total delay of the gain function (802), the active circuit, and the TOR.

Assuming the TOR is connected to the same power supply as the active circuit, it is preferrable that the gain and/or phase variations of the TOR due to variations of the power supply voltage are negligible or, at a minimum, well-known. If the pre-shaping signal output by the AWG (803) perfectly cancels the effects of power supply voltage variation on the active circuit, the output of the divider circuit is 1+0$i$, i.e., 0 dB amplitude and 0 degrees phase. If the pre-shaping signal output by the AWG does not cancel the effects of power supply voltage variation on the active circuit, the output of the divider circuit will be a complex error waveform, i.e., x dB amplitude and y degrees phase. The controller (804) can adjust the pre-shaping signal generated by the AWG by multiplying it with an inverse of the performance metric (i.e., –x dB amplitude and –y degrees phase), thereby producing an updated pre-shaping signal that better mitigates the effects of power supply voltage variations on the active circuit.

Figure 12:
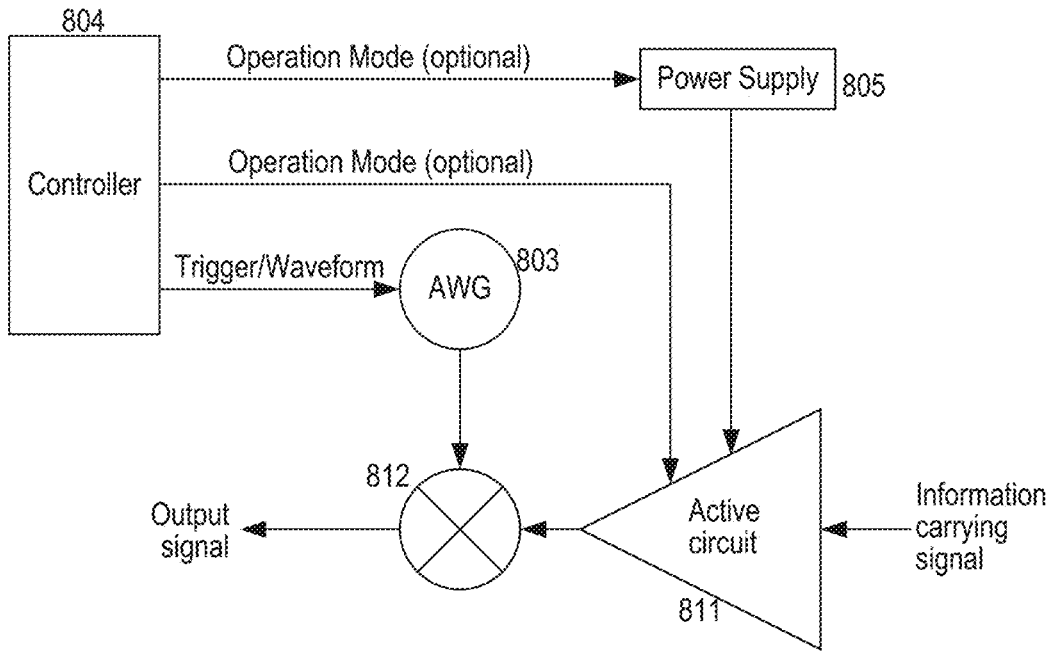

Although embodiments were described above in context of pre-shaping for a transmitted signal, other embodiments may apply post-shaping for a received signal. FIG. 12 shows an example apparatus that can implement post-shaping according to some embodiments. The apparatus includes a controller (804), AWG (803), and power supply (805), which may be similar to corresponding components shown in FIGS. 8-10. The apparatus also includes an active circuit (811), which receives an information carrying signal as input and processes it to produce a signal that is input to a multiplier (812). The multiplier may be similar to multiplier (802) shown in FIGS. 8-11, except that it applies the AWG-generated signal to the output of the active circuit rather than the information carrying signal.

In the embodiments shown in FIG. 12, the properties of the information carrying signal may be unknown since the signal is not generated within the apparatus. Even so, the controller has knowledge about operation mode(s) of the active circuit and the power supply in a TDD system, which facilitates post-shaping of the received signal when resuming from power save mode during transmit mode.

Figure 13:
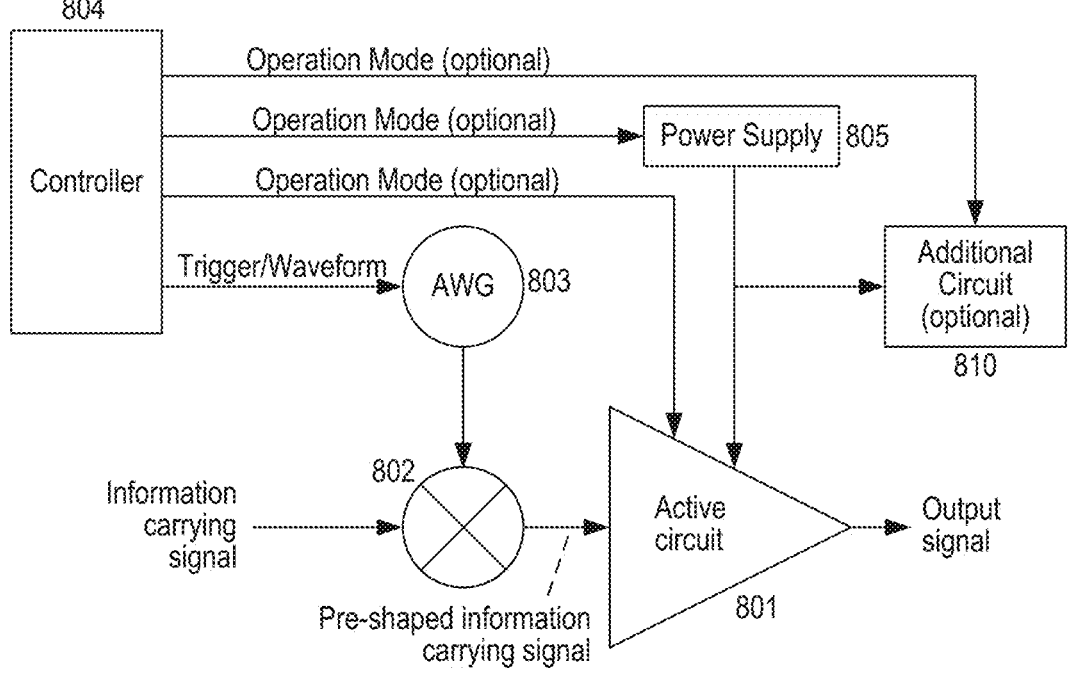

In some embodiments, pre-shaping may also be used to suppress the effects of power supply voltage variations, on the active circuit, that are caused by operation of one or more additional circuits that shares the same power supply. For example, the additional circuit(s) may be other active circuits with the same or different properties as the active circuit. One condition is that the effects of the additional circuit operation on the transfer function of the active circuit is known or predictable, and additional circuit operation mode can be controlled (at least to a necessary degree). FIG. 13 shows an example apparatus that is similar to the apparatus shown in FIG. 8, but also includes an additional circuit (810). The controller also outputs an additional operation mode signal that is an input to the additional circuit.

Figure 14:
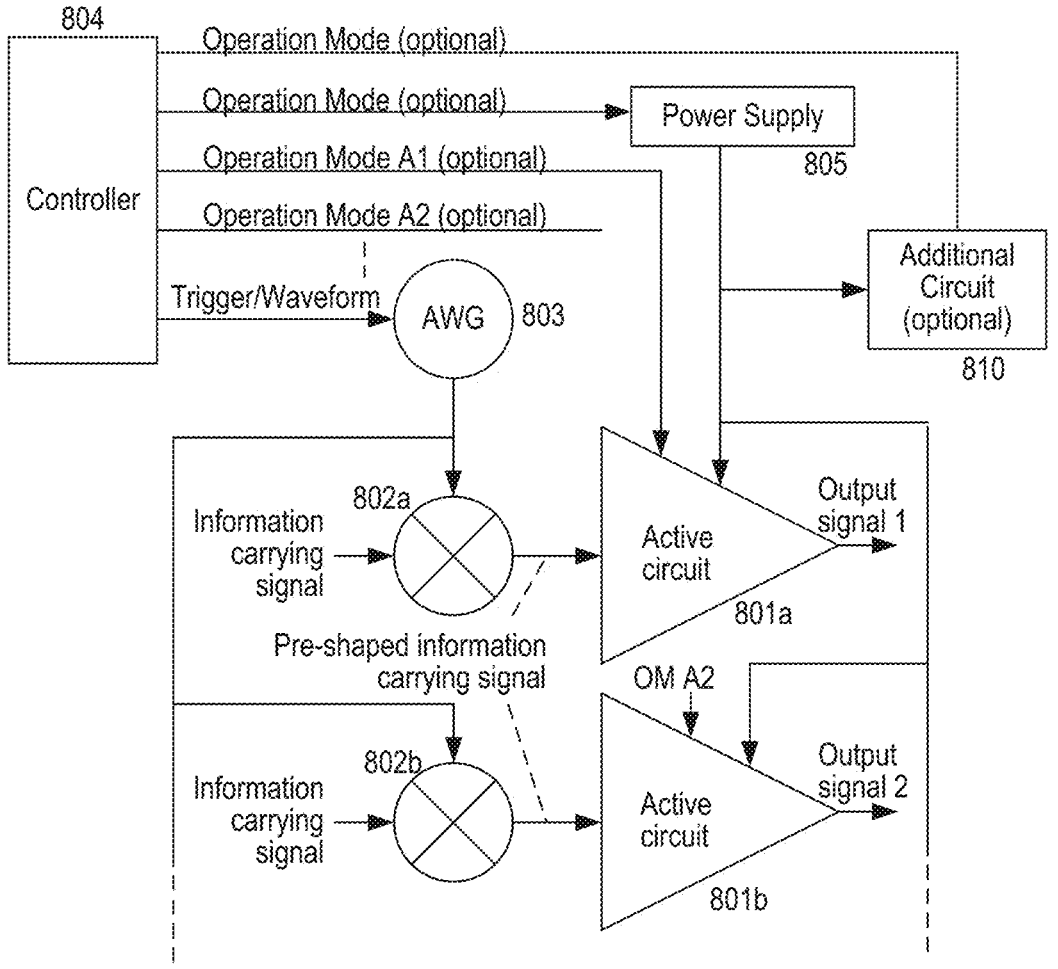

In some embodiments, an apparatus can include multiple identical active circuits, e.g., one per branch. If the average properties of the input signals to these respective active circuits are identical and/or do not influence transfer functions of other active circuits, a single AWG may be used to generate a pre-shaping signal common to all of the active circuits. FIG. 14 shows an example apparatus according to these embodiments, where a single AWG (803) creates a pre-shaping signal that is input to multipliers (802*a*, 802*b*) whose outputs drive respective active circuits (801*a*, 801*b*). The dashed lines at the bottom of FIG. 14 indicate that the arrangement can be extended to more than two instances.

Figure 15:
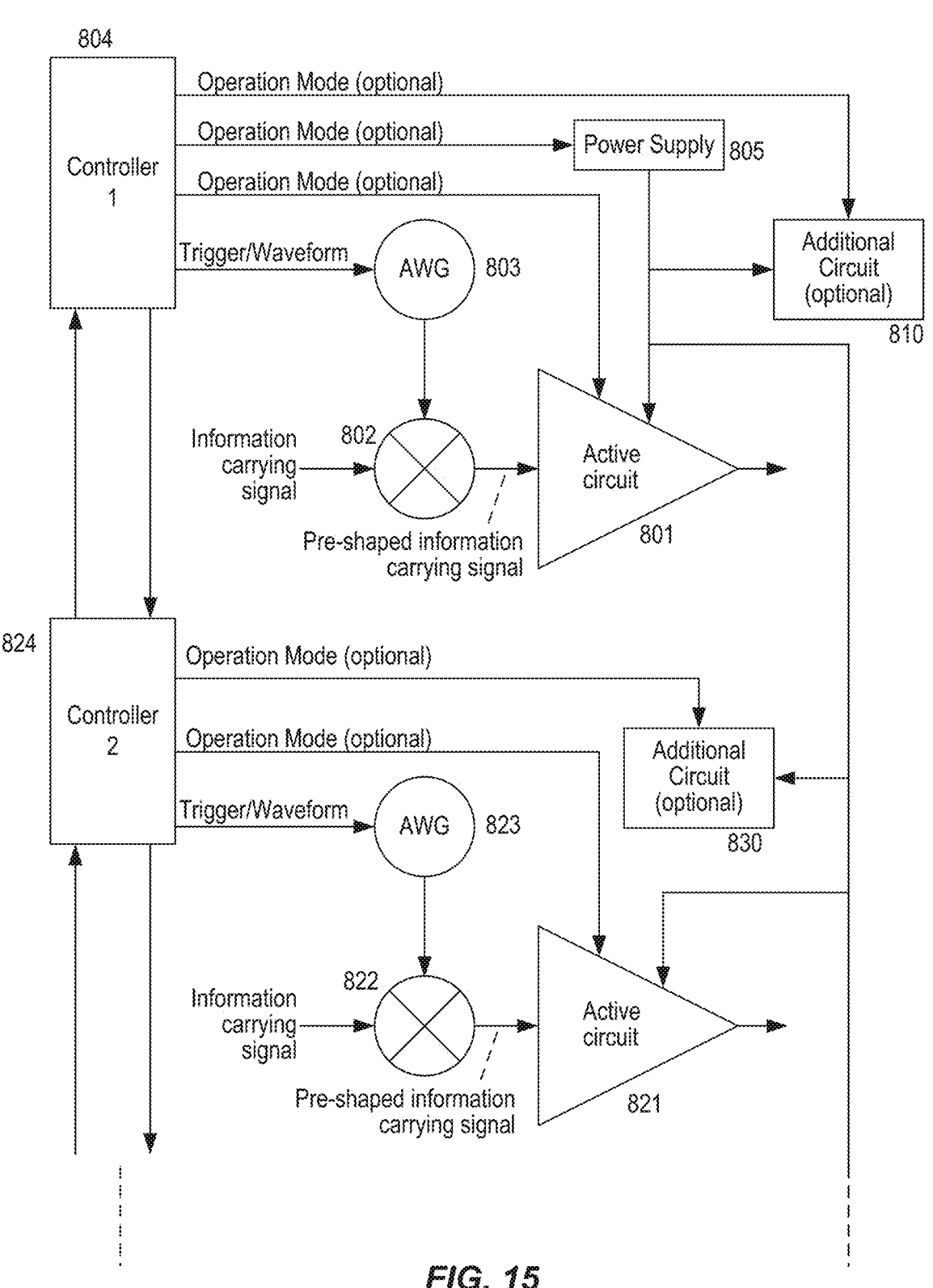

In some embodiments, a single power supply can provide voltage and current to multiple active circuits that are physically separated, e.g., in different integrated circuits and/or on different circuit boards, units, etc. In such embodiments, multiple instances of the pre-shaping functionality can be applied cooperatively to suppress the effects of power supply voltage variations on the multiple active circuits. FIG. 15 shows an example apparatus according to these embodiments. In this apparatus, a single power supply (805) supplies voltage and current to two active circuits (801, 821). The two active circuits are associated with respective controllers (804, 824), AWGs (803, 823), and multipliers (802, 822), which can operate in a similar manner as described above for other embodiments. In some variants, the active circuits are co-located with respective additional circuits (810, 830), similar to what is shown in FIG. 13. The dashed lines at the bottom of FIG. 15 indicate that the arrangement can be extended to more than two instances.

In addition, the two controllers can communicate with each other about the operation modes used for their associated active circuits and additional active circuits. Thus, one or both controllers can base selection of operation modes and/or pre-shaping vectors on those parameters selected by the other controller. This arrangement may be beneficial if bandwidth limitations and/or timing constraints prevent using a single AWG for all active circuits, as shown in FIG. 14. This arrangement may be beneficial by enabling AWGs to use waveforms customized for each active circuit's transfer function.

Various features of the embodiments described above correspond to various operations illustrated in FIGS. 16A-B, which show an exemplary method (e.g., procedure) for an apparatus configured to generate output signals for transmission, such as various apparatus described elsewhere herein. Although FIGS. 16A-B show specific blocks in a particular order, the operations of the exemplary method can be performed in different orders than shown and can be combined and/or divided into blocks having different functionality than shown. Optional blocks or operations are indicated by dashed lines.

The exemplary method includes the operations of block 1640, where the apparatus can detect a triggering condition related to a change in operational status of the apparatus. The exemplary method also includes the operations of block 1650, where the apparatus can select one of a plurality of pre-shaping vectors based on the triggering condition and past operating conditions of the apparatus during a plurality of most recent time intervals. Each of the pre-shaping vectors includes a plurality of values that compensate for effects of voltage variation of a power supply for the apparatus due to the triggering condition and the past operating conditions.

The exemplary method also includes the operations of block 1670, where during a plurality of time intervals subsequent to the triggering condition, the apparatus can apply the respective values of the selected pre-shaping vector to respective information-carrying signals, thereby generating pre-shaped information-carrying signals. The exemplary method can also include the operations of block 1680, where the apparatus can generate output signals for transmission during the plurality of subsequent time intervals. The output signals are generated by an active circuit of the apparatus using the pre-shaped information-carrying signals. The active circuit is powered by the power supply.

In some embodiments, the apparatus comprises one or more transmitter circuit branches and one or more receiver circuit branches. In some of these embodiments, the triggering condition includes one of the following being switched from an off state to an on state: at least a first number of transmitter circuit branches, or at least one but less than a second number of transmitter circuit branches. In some of these embodiments, the past operating conditions of the apparatus include the following: a number of the receiver circuit branches that are in an on state during each of the plurality of most recent time intervals, and a number of the transmitter circuit branches that are in an on state during each of the plurality of most recent time intervals.

In some of these embodiments, the exemplary method also includes the operations of block 1645, where the apparatus can determine whether the past operating conditions of the apparatus match any of one or more operating patterns associated with the triggering condition. In such case, selecting one of a plurality of pre-shaping vectors in block 1650 includes the operations of sub-block 1651, where based on detecting a match between the past operating conditions and a first operating pattern, the apparatus can select a pre-shaping vector corresponding to the triggering condition and the first operating pattern.

In some variants of these embodiments, the plurality of pre-shaping vectors are arranged in a codebook, with each pre-shaping vector in the codebook being associated with a unique index and a unique combination of the following: one of multiple predetermined triggering conditions, and one of multiple predetermined operating patterns. In some variants of these embodiments, selecting one of the pre-shaping vectors in block 1650 is performed by a pre-shaping controller, and also includes the operations of sub-block 1652, where the apparatus (e.g., the pre-shaping controller of a network node or UE) sends the selected pre-shaping vector, or an indication thereof (e.g., index), to an arbitrary waveform generator (AWG). In such case, the exemplary method also includes the operations of block 1665, where the apparatus (e.g., the AWG of the network node or UE) outputs the respective values of the pre-shaping vector associated with the received indication during the plurality of time intervals subsequent to the triggering condition.

In some variants of these embodiments, each operating pattern associated with the triggering condition includes one or more of the following:

a number of the receiver circuit branches that are in an on state during at least one most recent time interval, a minimum number of the receiver circuit branches that must be in an on state during at least one most recent time interval, a number of the transmitter circuit branches that are in an on state during at least one most recent time interval, a minimum number of the transmitter circuit branches that must be in an on state during at least one most recent time interval, and a maximum number of the transmitter circuit branches that can be in an on state during at least one most recent time interval.

In some variants of these embodiments, the one or more operating patterns associated with the triggering condition include a plurality of operating patterns, with the plurality of operating patterns being differentiated based on number of time intervals, prior to the triggering condition, until one of the following occurs: a non-zero number of receiver circuit branches are in an on state, or a non-zero number of transmitter circuit branches are in an on state.

In some embodiments, the effects of voltage variation of a power supply include one or more of the following, during the plurality of time intervals subsequent to the associated triggering condition: differences from desired power level of the output signal generated by the active circuit, and phase errors in the output signal generated by the active circuit. In some of these embodiments, the plurality of values in each pre-shaping vector include one or more of the following that compensate for effects of voltage variation of the power supply during the plurality of time intervals subsequent to the associated triggering condition: gains that are inverse of the differences from desired power level during the respective time intervals, and phase shifts that are inverse of the phase errors during the respective time intervals.

In some embodiments, the exemplary method can also include the operations of block 1610, where the apparatus (e.g., controller) can configure an operation mode of the power supply in accordance with the plurality of pre-shaping vectors. The configured operation mode includes one or more of the following settings: pre-charge on or off, and pre-discharge on or off.

In some embodiments, applying the respective values of the selected pre-shaping vector to respective information-carrying signals in block 1670 is performed selectively based on an operation mode of the active circuit. The operation mode of the active circuit includes one or more of the following settings:

pre-shaping on or off, pre-shaping performed for all or a subset of time intervals after a triggering event, pre-shaping performed for all or a subset of information-carrying signal types, and pre-shaping performed for all or a subset of information-carrying signal average properties.

In some embodiments, the exemplary method can also include the operations of block 1620, where the apparatus (e.g., pre-shaping controller) can configure an operation mode of one or more additional circuits of the apparatus in accordance with the plurality of pre-shaping vectors. The one or more additional circuits are powered by the power supply.

In some embodiments, the active circuit comprises a plurality of active circuits that generate a respective plurality of output signals for transmission during the plurality of subsequent time intervals based on a respective plurality of pre-shaped information-carrying signals. FIGS. 14 and 15 show examples of these embodiments. In some of these embodiments, the respective plurality of pre-shaped information-carrying signals are generated based on one of the following:

applying (e.g., in sub-block 1671) a single selected pre-shaping vector to a plurality of different information-carrying signals; or selecting (e.g., in sub-block 1653) one of the plurality of pre-shaping vectors for each of the plurality of different information-carrying signals, and applying (e.g., in sub-block 1672) the plurality of selected pre-shaping vectors to the plurality of different information-carrying signals.

In some embodiments, the exemplary method also includes the operations of block 1630, where the apparatus (e.g., pre-shaping controller) can receive, from a second controller associated with a second active circuit powered by the power supply, an indication of one or more of the following parameters: an operating mode for the second active circuit, and a second pre-shaping vector to be used for generating pre-shaped information-carrying signals input to the second active circuit. In such embodiments, one or more of the following is selected in block 1650 based on the indicated parameters: an operating mode of the active circuit, and the pre-shaping vector.

In some embodiments, during each time interval of the plurality of subsequent time intervals, the exemplary method can also include the following operations labelled with corresponding block numbers:

(1690) obtaining a representation of the signal generated by the active circuit for the time interval;

(1695) determining a performance metric based on the representation of the signal generated by the active circuit and on the information-carrying signal for the time interval; and (1660) based on the performance metric, adjusting the value of the selected pre-shaping vector for the time interval.

In some of these embodiments, the representation of the signal generated by the active circuit is obtained via reception by a transmitter observation receiver. Also, the performance metric is a complex error signal generated by a divider circuit from inputs of the representation of the signal generated by the active circuit and a delayed version of the information-carrying signal for the time interval. Additionally, the value of the selected pre-shaping vector is adjusted via multiplication by an inverse of the complex error signal. FIG. 11 shows an example of these embodiments.

Other embodiments can include an apparatus configured to generate output signals for transmission. For example, the apparatus can include a pre-shaping controller configured to detect a triggering condition related to a change in operational status of the apparatus and select one of a plurality of pre-shaping vectors based on the triggering condition and past operating conditions of the apparatus during a plurality of most recent time intervals. Each of the pre-shaping vectors includes a plurality of values that compensate for effects of voltage variation of a power supply for the apparatus due to the triggering condition and the past operating conditions. The apparatus also includes a signal multiplier configured to, responsive to the pre-shaping controller, apply the respective values of the selected pre-shaping vector to respective information-carrying signals during a plurality of time intervals subsequent to the triggering condition, thereby generating pre-shaped information-carrying signals. The apparatus also includes an active circuit powered by the power supply and configured to generate output signals for transmission during the plurality of subsequent time intervals using the pre-shaped information-carrying signals.

In some embodiments, the apparatus also includes one or more transmitter circuit branches and one or more receiver circuit branches. In some embodiments, the apparatus also includes an arbitrary waveform generator (AWG) configured to receive an index corresponding to the selected pre-shaping vector from the pre-shaping controller and, based on the index, output the respective values of the selected pre-shaping vector during the plurality of time intervals subsequent to the triggering condition.

Examples of such an apparatus are shown in FIGS. 4 and 8-15, described above.

Other embodiments include a signal pre-shaping apparatus comprising a pre-shaping controller configured to detect a triggering condition related to a change in operational status of an apparatus configured to generate one or more signals for transmission and to select one of a plurality of pre-shaping vectors based on the triggering condition and past operating conditions of the apparatus during a plurality of most recent time intervals. Each of the pre-shaping vectors includes a plurality of values that compensate for effects of voltage variation of a power supply of the apparatus due to the triggering condition and the past operating conditions. The pre-shaping apparatus also includes a signal multiplier configured to, responsive to the pre-shaping controller, apply the respective values of the selected pre-shaping vector to respective information-carrying signals during a plurality of time intervals subsequent to the triggering condition, thereby generating pre-shaped information-carrying signals.

In some embodiments, the apparatus also includes one or more transmitter circuit branches and one or more receiver circuit branches.

In some embodiments, the apparatus also includes an AWG configured to receive the selected pre-shaping vector, or an indication thereof, from the pre-shaping controller and to output the respective values of the selected pre-shaping vector during the plurality of time intervals subsequent to the triggering condition.

In some embodiments, the apparatus also includes the following:

a transmitter observation receiver configured to obtain a representation of the signal generated by the active circuit during each time interval of the plurality of subsequent time intervals; and a divider circuit configured to generate a complex error signal from inputs of the representation of the signal generated by the active circuit and a delayed version of the information-carrying signal for the time interval.

In such embodiments, the pre-shaping controller is further configured to adjust the value of the selected pre-shaping vector for the time interval via multiplication by the inverse of the complex error signal. FIG. 11 shows an example of these embodiments.

Additionally, the exemplary method shown in FIGS. 16A-B can be realized as a non-transitory, computer-readable medium storing computer-executable instructions. When executed by a pre-shaping controller of an apparatus configured to generate output signals for transmission, the instructions configure the apparatus to perform operations corresponding to any of those described above with reference to FIGS. 16A-B.

Additionally, the exemplary method shown in FIGS. 16A-B can be realized as a computer program comprising computer-executable instructions. When executed by a pre-shaping controller of an apparatus configured to generate output signals for transmission, the instructions configure the apparatus to perform operations corresponding to any of those described above with reference to FIGS. 16A-B.

FIG. 17 shows an example of a communication system 1700 in accordance with some embodiments. In this example, communication system 1700 includes a telecommunication network 1702 that includes an access network 1704 (e.g., RAN) and a core network 1706, which includes one or more core network nodes 1708. Access network 1704 includes one or more access network nodes, such as network nodes 1710*a-b* (one or more of which may be generally referred to as network nodes 1710), or any other similar 3GPP access nodes or non-3GPP access points. Moreover, as will be appreciated by those of skill in the art, a network node is not necessarily limited to an implementation in which a radio portion and a baseband portion are supplied and integrated by a single vendor. Thus, it will be understood that network nodes include disaggregated implementations or portions thereof. For example, in some embodiments, telecommunication network 1702 includes one or more Open-RAN (ORAN) network nodes. An ORAN network node is a node in telecommunication network 1702 that supports an ORAN specification (e.g., a specification published by the O-RAN Alliance, or any similar organization)

and may operate alone or together with other nodes to implement one or more functionalities of any node in telecommunication network 1702, including one or more network nodes 1710 and/or core network nodes 1708.

Examples of an ORAN network node include an open radio unit (O-RU), an open distributed unit (O-DU), an open central unit (O-CU), including an O-CU control plane (O-CU-CP) or an O-CU user plane (O-CU-UP), a RAN intelligent controller (near-real time or non-real time) hosting software or software plug-ins, such as a near-real time control application (e.g., xApp) or a non-real time control application (e.g., rApp), or any combination thereof (the adjective "open" designating support of an ORAN specification). The network node may support a specification by, for example, supporting an interface defined by the ORAN specification, such as an A1, F1, W1, E1, E2, X2, Xn interface, an open fronthaul user plane interface, or an open fronthaul management plane interface. Moreover, an ORAN access node may be a logical node in a physical node. Furthermore, an ORAN network node may be implemented in a virtualization environment (described further below) in which one or more network functions are virtualized. For example, the virtualization environment may include an O-Cloud computing platform orchestrated by a Service Management and Orchestration Framework via an O-2 interface defined by the O-RAN Alliance or comparable technologies. Network nodes 1710 facilitate direct or indirect connection of UEs, such as by connecting UEs 1712*a-d* (one or more of which may be generally referred to as UEs 1712) to core network 1706 over one or more wireless connections.

Example wireless communications over a wireless connection include transmitting and/or receiving wireless signals using electromagnetic waves, radio waves, infrared waves, and/or other types of signals suitable for conveying information without the use of wires, cables, or other material conductors. Moreover, in different embodiments, communication system 1700 may include any number of wired or wireless networks, network nodes, UEs, and/or any other components or systems that may facilitate or participate in the communication of data and/or signals whether via wired or wireless connections. Communication system 1700 may include and/or interface with any type of communication, telecommunication, data, cellular, radio network, and/or or other similar type of system.

UEs 1712 may be any of a wide variety of communication devices, including wireless devices arranged, configured, and/or operable to communicate wirelessly with network nodes 1710 and other communication devices. Similarly, network nodes 1710 are arranged, capable, configured, and/ or operable to communicate directly or indirectly with UEs 1712 and/or with other network nodes or equipment in telecommunication network 1702 to enable and/or provide network access, such as wireless network access, and/or to perform other functions, such as administration in telecommunication network 1702.

In some embodiments, UEs 1712 and/or network nodes 1710 can include the apparatus shown in any of FIGS. 4 and 8-14, according to any of the embodiments described above.

In the depicted example, core network 1706 connects network nodes 1710 to one or more hosts, such as host 1716. These connections may be direct or indirect via one or more intermediary networks or devices. In other examples, network nodes may be directly coupled to hosts. Core network 1706 includes one or more core network nodes (e.g., 1708) that are structured with hardware and software components. Features of these components may be substantially similar to those described with respect to the UEs, network nodes, and/or hosts, such that the descriptions thereof are generally applicable to the corresponding components of core network node 1708. Example core network nodes include functions of one or more of a Mobile Switching Center (MSC), Mobility Management Entity (MME), Home Subscriber Server (HSS), Access and Mobility Management Function (AMF), Session Management Function (SMF), Authentication Server Function (AUSF), Subscription Identifier Deconcealing function (SIDF), Unified Data Management (UDM), Security Edge Protection Proxy (SEPP), Network Exposure Function (NEF), and/or a User Plane Function (UPF).

Host 1716 may be under the ownership or control of a service provider other than an operator or provider of access network 1704 and/or telecommunication network 1702, and may be operated by the service provider or on behalf of the service provider. Host 1716 may host a variety of applications to provide one or more service. Examples of such applications include live and pre-recorded audio/video content, data collection services such as retrieving and compiling data on various ambient conditions detected by a plurality of UEs, analytics functionality, social media, functions for controlling or otherwise interacting with remote devices, functions for an alarm and surveillance center, or any other such function performed by a server.

As a whole, communication system 1700 of FIG. 17 enables connectivity between the UEs, network nodes, and hosts. In that sense, the communication system may be configured to operate according to predefined rules or procedures, such as specific standards that include, but are not limited to: Global System for Mobile Communications (GSM); Universal Mobile Telecommunications System (UMTS); Long Term Evolution (LTE), and/or other suitable 2G, 3G, 4G, 5G standards, or any applicable future generation standard (e.g., 6G); wireless local area network (WLAN) standards, such as the Institute of Electrical and Electronics Engineers (IEEE) 802.11 standards (WiFi); and/ or any other appropriate wireless communication standard, such as the Worldwide Interoperability for Microwave Access (WiMax), Bluetooth, Z-Wave, Near Field Communication (NFC) ZigBee, LiFi, and/or any low-power wide-area network (LPWAN) standards such as LoRa and Sigfox.

In some examples, telecommunication network 1702 is a cellular network that implements 3GPP standardized features. Accordingly, telecommunication network 1702 may support network slicing to provide different logical networks to different devices that are connected to telecommunication network 1702. For example, telecommunication network 1702 may provide Ultra Reliable Low Latency Communication (URLLC) services to some UEs, while providing Enhanced Mobile Broadband (eMBB) services to other UEs, and/or Massive Machine Type Communication (mMTC)/ Massive IoT services to yet further UEs.

In some examples, UEs 1712 are configured to transmit and/or receive information without direct human interaction. For instance, a UE may be designed to transmit information to access network 1704 on a predetermined schedule, when triggered by an internal or external event, or in response to requests from access network 1704. Additionally, a UE may be configured for operating in single- or multi-RAT or multi-standard mode. For example, a UE may operate with any one or combination of Wi-Fi, NR (New Radio) and LTE, i.e. being configured for multi-radio dual connectivity (MR-DC), such as E-UTRAN (Evolved-UMTS Terrestrial Radio Access Network) New Radio—Dual Connectivity (EN-DC).

In the example, hub 1714 communicates with access network 1704 to facilitate indirect communication between one or more UEs (e.g., 1712*c* and/or 1712*d*) and network nodes (e.g., network node 1710*b*). In some examples, hub 1714 may be a controller, router, content source and ana- lytics, or any of the other communication devices described herein regarding UEs. For example, hub 1714 may be a broadband router enabling access to core network 1706 for the UEs. As another example, hub 1714 may be a controller that sends commands or instructions to one or more actua- tors in the UEs. Commands or instructions may be received from the UEs, network nodes 1710, or by executable code, script, process, or other instructions in hub 1714. As another example, hub 1714 may be a data collector that acts as temporary storage for UE data and, in some embodiments, may perform analysis or other processing of the data. As another example, hub 1714 may be a content source. For example, for a UE that is a VR headset, display, loudspeaker or other media delivery device, hub 1714 may retrieve VR assets, video, audio, or other media or data related to sensory information via a network node, which hub 1714 then provides to the UE either directly, after performing local processing, and/or after adding additional local content. In still another example, hub 1714 acts as a proxy server or orchestrator for the UEs, in particular if one or more of the UEs are low energy IoT devices.

Hub 1714 may have a constant/persistent or intermittent connection to network node 1710*b*. Hub 1714 may also allow for a different communication scheme and/or schedule between hub 1714 and UEs (e.g., 1712*c* and/or 1712*d*), and between hub 1714 and core network 1706. In other examples, hub 1714 is connected to core network 1706 and/or one or more UEs via a wired connection. Moreover, hub 1714 may be configured to connect to an M2M service provider over access network 1704 and/or to another UE over a direct connection. In some scenarios, UEs may establish a wireless connection with network nodes 1710 while still connected via hub 1714 via a wired or wireless connection. In some embodiments, hub 1714 may be a dedicated hub—that is, a hub whose primary function is to route communications to/from the UEs from/to network node 1710*b*. In other embodiments, hub 1714 may be a non-dedicated hub—that is, a device which is capable of operating to route communications between the UEs and network node 1710*b*, but which is additionally capable of operating as a communication start and/or end point for certain data channels.

Figure 18:
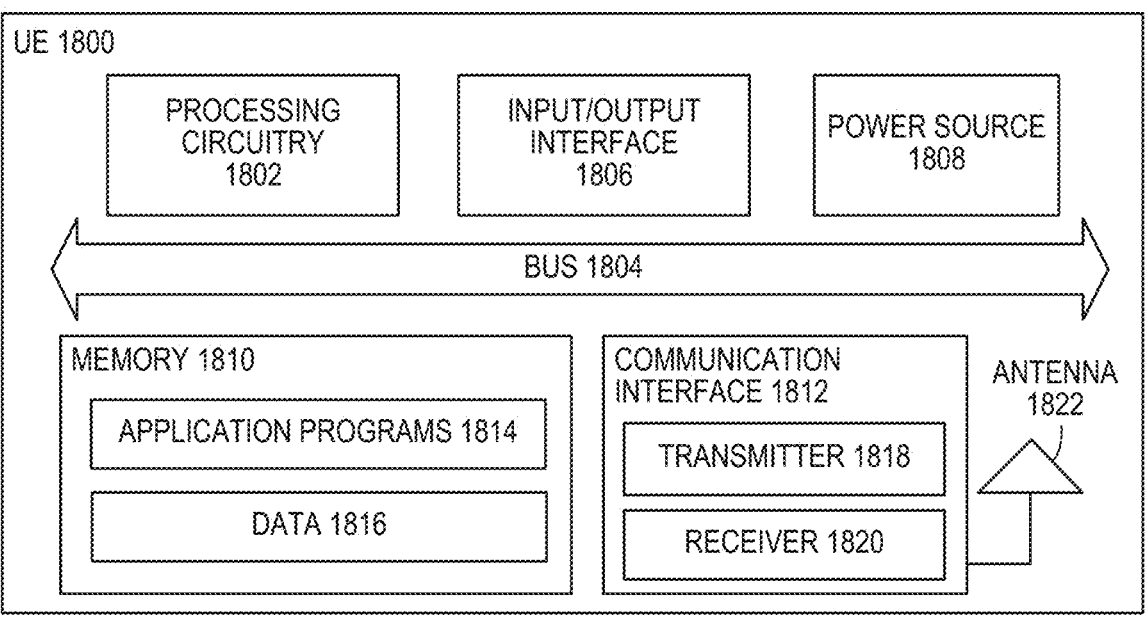
FIG. 18 shows a user equipment (UE) according to some embodiments of the present disclosure.

FIG. 18 shows an exemplary user equipment (UE) 1800 in accordance with some embodiments. As used herein, the term "user equipment" (or UE for short) refers to a device capable, configured, arranged and/or operable to communi- cate wirelessly with network nodes and/or with other UEs. Communicating wirelessly can involve transmitting and/or receiving wireless signals using electromagnetic waves, radio waves, infrared waves, and/or other types of signals suitable for conveying information through air. Unless oth- erwise noted, the term "wireless device" is used interchange- ably herein with the term "user equipment" (or UE), with both of these terms having a different meaning than the term "network node".

A UE may support device-to-device (D2D) communica- tion, for example by implementing a 3GPP standard for sidelink communication, Dedicated Short-Range Commu- nication (DSRC), vehicle-to-vehicle (V2V), vehicle-to-in- frastructure (V2I), or vehicle-to-everything (V2X). In other examples, a UE may not necessarily have a user in the sense of a human user who owns and/or operates the relevant device. Instead, a UE may represent a device that is intended for sale to, or operation by, a human user but which may not, or which may not initially, be associated with a specific human user (e.g., a smart sprinkler controller). Alternatively, a UE may represent a device that is not intended for sale to, or operation by, an end user but which may be associated with or operated for the benefit of a user (e.g., a smart power meter).

UE 1800 includes processing circuitry 1802 that is opera- tively coupled via bus 1804 to input/output interface 1806, power source 1808, memory 1810, communication interface 1812, and possibly other components. Certain UEs may utilize all or a subset of the components shown in FIG. 18. The level of integration between the components may vary from one UE to another UE. Further, certain UEs may contain multiple instances of a component, such as multiple processors, memories, transceivers, transmitters, receivers, etc.

Processing circuitry 1802 is configured to process instruc- tions and data and may be configured to implement any sequential state machine operative to execute instructions stored as machine-readable computer programs in memory 1810. Processing circuitry 1802 may be implemented as one or more hardware-implemented state machines (e.g., in discrete logic, field-programmable gate arrays (FPGAs), application specific integrated circuits (ASICs), etc.); pro- grammable logic together with appropriate firmware; one or more stored computer programs, general-purpose proces- sors, such as a microprocessor or digital signal processor (DSP), together with appropriate software; or any combina- tion of the above. For example, processing circuitry 1802 may include multiple central processing units (CPUs).

In the example, input/output interface 1806 may be con- figured to provide an interface or interfaces to an input device, output device, or one or more input and/or output devices. Examples of an output device include a speaker, a sound card, a video card, a display, a monitor, a printer, an actuator, an emitter, a smartcard, another output device, or any combination thereof. An input device may allow a user to capture information into UE 1800. Examples of an input device include a touch-sensitive or presence-sensitive dis- play, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, a biometric sensor, etc., or any combination thereof. An output device may use the same type of interface port as an input device. For example, a Universal Serial Bus (USB) port may be used to provide an input device and an output device.

In some embodiments, power source 1808 is structured as a battery or battery pack. Other types of power sources, such as an external power source (e.g., an electricity outlet), photovoltaic device, or power cell, may be used. Power source 1808 may further include power circuitry for deliv- ering power from power source 1808 itself, and/or an external power source, to the various parts of UE 1800 via input circuitry or an interface such as an electrical power cable. Delivering power may be, for example, for charging of power source 1808. Power circuitry may perform any formatting, converting, or other modification to the power from power source 1808 to make the power suitable for the respective components of UE 1800 to which power is supplied.

Memory 1810 may be or be configured to include memory such as random access memory (RAM), read-only memory (ROM), programmable read-only memory (PROM), erasable programmable read-only memory (EPROM), electrically erasable programmable read-only memory (EEPROM), magnetic disks, optical disks, hard disks, removable cartridges, flash drives, and so forth. In one example, memory 1810 includes one or more application programs 1814, such as an operating system, web browser application, a widget, gadget engine, or other application, and corresponding data 1816. Memory 1810 may store, for use by UE 1800, any of a variety of various operating systems or combinations of operating systems.

Memory 1810 may be configured to include a number of physical drive units, such as redundant array of independent disks (RAID), flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as tamper resistant module in the form of a universal integrated circuit card (UICC) including one or more subscriber identity modules (SIMs), such as a USIM and/or ISIM, other memory, or any combination thereof. The UICC may for example be an embedded UICC (eUICC), integrated UICC (iUICC) or a removable UICC commonly known as 'SIM card.' Memory 1810 may allow UE 1800 to access instructions, application programs and the like, stored on transitory or non-transitory memory media, to off-load data, or to upload data. An article of manufacture, such as one utilizing a communication system may be tangibly embodied as or in memory 1810, which may be or comprise a device-readable storage medium.

Processing circuitry 1802 may be configured to communicate with an access network or other network using communication interface 1812. Communication interface 1812 may comprise one or more communication subsystems and may include or be communicatively coupled to an antenna 1822. Communication interface 1812 may include one or more transceivers used to communicate, such as by communicating with one or more remote transceivers of another device capable of wireless communication (e.g., another UE or a network node in an access network). Each transceiver may include transmitter 1818 and/or receiver 1820 appropriate to provide network communications (e.g., optical, electrical, frequency allocations, and so forth). Moreover, transmitter 1818 and/or receiver 1820 may be coupled to one or more antennas (e.g., antenna 1822) and may share circuit components, software, or firmware, or alternatively be implemented separately.

In the illustrated embodiment, communication functions of communication interface 1812 may include cellular communication, Wi-Fi communication, LPWAN communication, data communication, voice communication, multimedia communication, short-range communications such as Bluetooth, near-field communication, location-based communication such as the use of the global positioning system (GPS) to determine a location, another like communication function, or any combination thereof. Communications may be implemented in according to one or more communication protocols and/or standards, such as IEEE 802.11, Code Division Multiplexing Access (CDMA), Wideband Code Division Multiple Access (WCDMA), GSM, LTE, New Radio (NR), UMTS, WiMax, Ethernet, transmission control protocol/internet protocol (TCP/IP), synchronous optical networking (SONET), Asynchronous Transfer Mode (ATM), QUIC, Hypertext Transfer Protocol (HTTP), and so forth.

Regardless of the type of sensor, a UE may provide an output of data captured by its sensors, through its communication interface 1812, via a wireless connection to a network node. Data captured by sensors of a UE can be communicated through a wireless connection to a network node via another UE. The output may be periodic (e.g., once every 15 minutes if it reports the sensed temperature), random (e.g., to even out the load from reporting from several sensors), in response to a triggering event (e.g., when moisture is detected an alert is sent), in response to a request (e.g., a user initiated request), or a continuous stream (e.g., a live video feed of a patient).

As another example, a UE comprises an actuator, a motor, or a switch, related to a communication interface configured to receive wireless input from a network node via a wireless connection. In response to the received wireless input the states of the actuator, the motor, or the switch may change. For example, the UE may comprise a motor that adjusts the control surfaces or rotors of a drone in flight according to the received input or to a robotic arm performing a medical procedure according to the received input.

A UE, when in the form of an Internet of Things (IoT) device, may be a device for use in one or more application domains, these domains comprising, but not limited to, city wearable technology, extended industrial application and healthcare. Non-limiting examples of such an IoT device are a device which is or which is embedded in: a connected refrigerator or freezer, a TV, a connected lighting device, an electricity meter, a robot vacuum cleaner, a voice controlled smart speaker, a home security camera, a motion detector, a thermostat, a smoke detector, a door/window sensor, a flood/moisture sensor, an electrical door lock, a connected doorbell, an air conditioning system like a heat pump, an autonomous vehicle, a surveillance system, a weather monitoring device, a vehicle parking monitoring device, an electric vehicle charging station, a smart watch, a fitness tracker, a head-mounted display for Augmented Reality (AR) or Virtual Reality (VR), a wearable for tactile augmentation or sensory enhancement, a water sprinkler, an animal- or item-tracking device, a sensor for monitoring a plant or animal, an industrial robot, an Unmanned Aerial Vehicle (UAV), and any kind of medical device, like a heart rate monitor or a remote controlled surgical robot. A UE in the form of an IoT device comprises circuitry and/or software in dependence of the intended application of the IoT device in addition to other components as described in relation to UE 1800 shown in FIG. 18.

As yet another specific example, in an IoT scenario, a UE may represent a machine or other device that performs monitoring and/or measurements, and transmits the results of such monitoring and/or measurements to another UE and/or a network node. The UE may in this case be an M2M device, which may in a 3GPP context be referred to as an MTC device. As one particular example, the UE may implement the 3GPP NB-IoT standard. In other scenarios, a UE may represent a vehicle, such as a car, a bus, a truck, a ship and an airplane, or other equipment that is capable of monitoring and/or reporting on its operational status or other functions associated with its operation.

In practice, any number of UEs may be used together with respect to a single use case. For example, a first UE might be or be integrated in a drone and provide the drone's speed information (obtained through a speed sensor) to a second UE that is a remote controller operating the drone. When the user makes changes from the remote controller, the first UE may adjust the throttle on the drone (e.g. by controlling an actuator) to increase or decrease the drone's speed. The first and/or the second UE can also include more than one of the functionalities described above. For example, a UE might comprise the sensor and the actuator, and handle communication of data for both the speed sensor and the actuators.

In some embodiments, UE 1800 can include the apparatus shown in any of FIGS. 4 and 8-15, according to any of the embodiments described above. For example, the apparatus can be part of processing circuitry 1802 and communication interface circuitry 1812, which can be configured to perform operations attributed to the apparatus in any of the embodiments described above.

Figure 19:
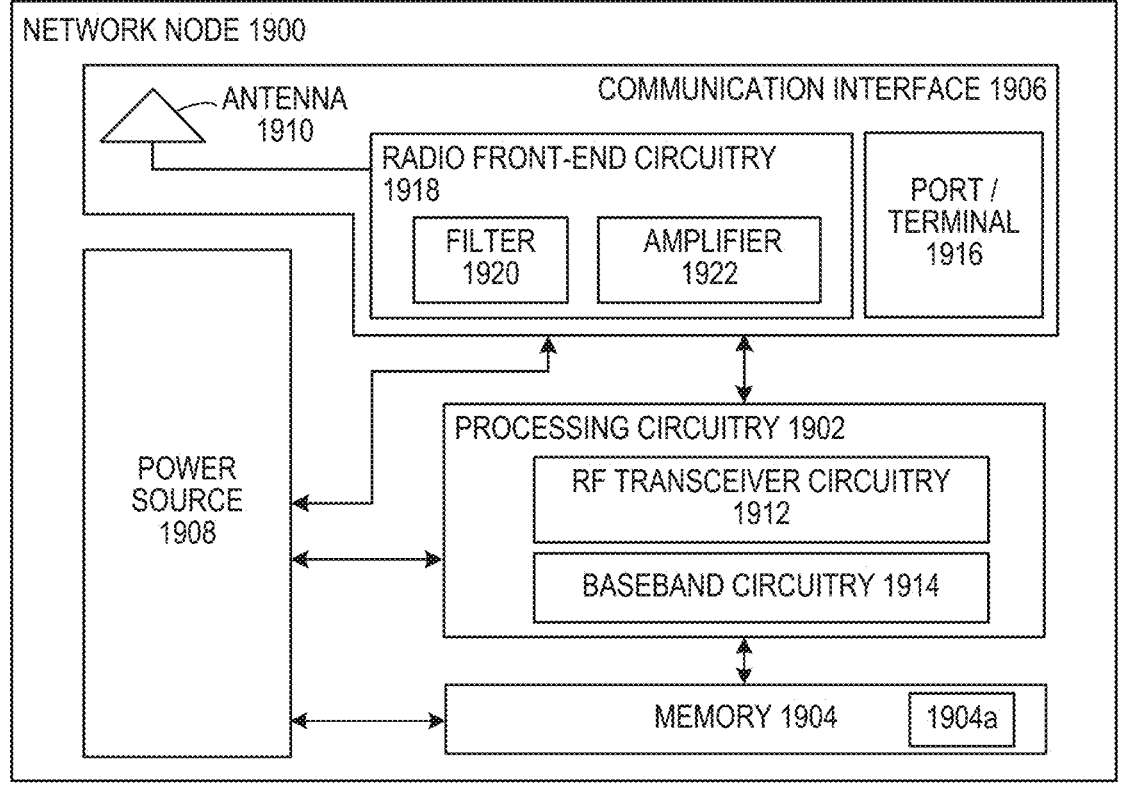
FIG. 19 shows a network node according to some embodiments of the present disclosure.

FIG. 19 shows a network node 1900 in accordance with some embodiments. As used herein, "network node" refers to equipment capable, configured, arranged and/or operable to communicate directly or indirectly with a UE and/or with other network nodes or equipment, in a telecommunication network. Examples of network nodes include, but are not limited to, access points (APs) (e.g., radio access points), base stations (e.g., radio base stations, Node Bs, eNBs, gNBs), and O-RAN nodes or components of an O-RAN node (e.g., O-RU, O-DU, O-CU).

Base stations may be categorized based on the amount of coverage they provide (or, stated differently, their transmit power level) and so, depending on the provided amount of coverage, may be referred to as femto base stations, pico base stations, micro base stations, or macro base stations. A base station may be a relay node or a relay donor node controlling a relay. A network node may also include one or more (or all) parts of a distributed radio base station such as centralized digital units, distributed units (e.g., in an O-RAN access node) and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS).

Other examples of network nodes include multiple transmission point (multi-TRP) 5G access nodes, multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), Operation and Maintenance (O & M) nodes, Operations Support System (OSS) nodes, Self-Organizing Network (SON) nodes, positioning nodes (e.g., Evolved Serving Mobile Location Centers (E-SMLCs)), and/or Minimization of Drive Tests (MDTs).

Network node 1900 includes processing circuitry 1902, memory 1904, communication interface 1906, and power source 1908. Network node 1900 may be composed of multiple physically separate components (e.g., a NodeB component and a RNC component, or a BTS component and a BSC component, etc.), which may each have their own respective components. In certain scenarios in which network node 1900 comprises multiple separate components (e.g., BTS and BSC components), one or more of the separate components may be shared among several network nodes. For example, a single RNC may control multiple NodeBs. In such a scenario, each unique NodeB and RNC pair, may in some instances be considered a single separate network node. In some embodiments, network node 1900 may be configured to support multiple radio access technologies (RATs). In such embodiments, some components may be duplicated (e.g., separate memory 1904 for different RATs) and some components may be reused (e.g., a same antenna 1910 may be shared by different RATs). Network node 1900 may also include multiple sets of the various illustrated components for different wireless technologies integrated into network node 1900, for example GSM, WCDMA, LTE, NR, WiFi, Zigbee, Z-wave, LoRaWAN, Radio Frequency Identification (RFID) or Bluetooth wireless technologies. These wireless technologies may be integrated into the same or different chip or set of chips and other components within network node 1900.

Processing circuitry 1902 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 1900 components, such as memory 1904, to provide network node 1900 functionality.

In some embodiments, processing circuitry 1902 includes a system on a chip (SOC). In some embodiments, processing circuitry 1902 includes radio frequency (RF) transceiver circuitry 1912 and/or baseband processing circuitry 1914. In some embodiments, RF transceiver circuitry 1912 and/or baseband processing circuitry 1914 may be on separate chips (or sets of chips), boards, or units, such as radio units and digital units. In alternative embodiments, part or all of RF transceiver circuitry 1912 and/or baseband processing circuitry 1914 may be on the same chip or set of chips, boards, or units.

Memory 1904 may comprise any form of volatile or non-volatile computer-readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device-readable and/or computer-executable memory devices that store information, data, and/or instructions that may be used by processing circuitry 1902. Memory 1904 may store any suitable instructions, data, or information, including a computer program, software, an application including one or more of logic, rules, code, tables, and/or other instructions (collected denoted computer program 1904a, which may be in the form of a computer program product) capable of being executed by processing circuitry 1902 and utilized by network node 1900. Memory 1904 may be used to store any calculations made by processing circuitry 1902 and/or any data received via communication interface 1906. In some embodiments, processing circuitry 1902 and memory 1904 is integrated.

Communication interface 1906 is used in wired or wireless communication of signaling and/or data between a network node, access network, and/or UE. As illustrated, communication interface 1906 comprises port(s)/terminal(s) 1916 to send and receive data, for example to and from a network over a wired connection. Communication interface 1906 also includes radio front-end circuitry 1918 that may be coupled to, or in certain embodiments a part of, antenna 1910. Radio front-end circuitry 1918 comprises filters 1920 and amplifiers 1922. Radio front-end circuitry 1918 may be connected to an antenna 1910 and processing circuitry 1902, and may be configured to condition signals communicated between antenna 1910 and processing circuitry 1902. Radio front-end circuitry 1918 may receive digital data that is to be sent out to other network nodes or UEs via a wireless connection. Radio front-end circuitry 1918 may convert the digital data into a radio signal having the appropriate channel and bandwidth parameters using a combination of filters 1920 and/or amplifiers 1922. The radio signal may then be transmitted via antenna 1910. Similarly, when receiving data, antenna 1910 may collect radio signals which are then converted into digital data by radio front-end circuitry 1918. The digital data may be passed to processing circuitry 1902. In other embodiments, the communication interface may comprise different components and/or different combinations of components.

In certain alternative embodiments, network node 1900 does not include separate radio front-end circuitry 1918, instead, processing circuitry 1902 includes radio front-end circuitry and is connected to antenna 1910. Similarly, in some embodiments, all or some of RF transceiver circuitry 1912 is part of communication interface 1906. In still other embodiments, communication interface 1906 includes one or more ports or terminals 1916, radio front-end circuitry 1918, and RF transceiver circuitry 1912, as part of a radio unit (not shown), and communication interface 1906 communicates with baseband processing circuitry 1914, which is part of a digital unit (not shown).

Antenna 1910 may include one or more antennas, or antenna arrays, configured to send and/or receive wireless signals. Antenna 1910 may be coupled to radio front-end circuitry 1918 and may be any type of antenna capable of transmitting and receiving data and/or signals wirelessly. In certain embodiments, antenna 1910 is separate from network node 1900 and connectable to network node 1900 through an interface or port.

Antenna 1910, communication interface 1906, and/or processing circuitry 1902 may be configured to perform any receiving operations and/or certain obtaining operations described herein as being performed by the network node. Any information, data and/or signals may be received from a UE, another network node and/or any other network equipment. Similarly, antenna 1910, communication interface 1906, and/or processing circuitry 1902 may be configured to perform any transmitting operations described herein as being performed by the network node. Any information, data and/or signals may be transmitted to a UE, another network node and/or any other network equipment.

Power source 1908 provides power to the various components of network node 1900 in a form suitable for the respective components (e.g., at a voltage and current level needed for each respective component). Power source 1908 may further comprise, or be coupled to, power management circuitry to supply the components of network node 1900 with power for performing the functionality described herein. For example, network node 1900 may be connectable to an external power source (e.g., the power grid, an electricity outlet) via an input circuitry or interface such as an electrical cable, whereby the external power source supplies power to power circuitry of power source 1908. As a further example, power source 1908 may comprise a source of power in the form of a battery or battery pack which is connected to, or integrated in, power circuitry. The battery may provide backup power should the external power source fail.

Embodiments of network node 1900 may include additional components beyond those shown in FIG. 19 for providing certain aspects of the network node's functionality, including any of the functionality described herein and/or any functionality necessary to support the subject matter described herein. For example, network node 1900 may include user interface equipment to allow input of information into network node 1900 and to allow output of information from network node 1900. This may allow a user to perform diagnostic, maintenance, repair, and other administrative functions for network node 1900.

In some embodiments, network node 1900 can include the apparatus shown in any of FIGS. 4 and 8-15, according to any of the embodiments described above. For example, the apparatus can be part of processing circuitry 1902 and communication interface circuitry 1906, which can be configured to perform operations attributed to the apparatus in any of the embodiments described above.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures that, although not explicitly shown or described herein, embody the principles of the disclosure and can be thus within the spirit and scope of the disclosure. Various exemplary embodiments can be used together with one another, as well as interchangeably therewith, as should be understood by those having ordinary skill in the art.

The term unit, as used herein, can have conventional meaning in the field of electronics, electrical devices and/or electronic devices and can include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include Digital Signal Processor (DSPs), special-purpose digital logic, and the like. The processing circuitry may be configured to execute program code stored in memory, which may include one or several types of memory such as Read Only Memory (ROM), Random Access Memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according to one or more embodiments of the present disclosure.

As described herein, device and/or apparatus can be represented by a semiconductor chip, a chipset, or a (hardware) module comprising such chip or chipset; this, however, does not exclude the possibility that a functionality of a device or apparatus, instead of being hardware implemented, be implemented as a software module such as a computer program or a computer program product comprising executable software code portions for execution or being run on a processor. Furthermore, functionality of a device or apparatus can be implemented by any combination of hardware and software. A device or apparatus can also be regarded as an assembly of multiple devices and/or apparatuses, whether functionally in cooperation with or independently of each other. Moreover, devices and apparatuses can be implemented in a distributed fashion throughout a system, so long as the functionality of the device or apparatus is preserved. Such and similar principles are considered as known to a skilled person.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition, certain terms used in the present disclosure, including the specification and drawings, can be used synonymously in certain instances (e.g., "data" and "information"). It should be understood, that although these terms (and/or other terms that can be synonymous to one another) can be used synonymously herein, there can be instances when such words can be intended to not be used synonymously.

Embodiments of the techniques and apparatus described herein also include, but are not limited to, the following enumerated examples:

A1. A method performed by an apparatus configured to generate one or more signals for transmission, the method comprising:

detecting a triggering condition related to a change in current operational status of the apparatus;

selecting one of a plurality of pre-shaping vectors based on the triggering condition and past operating conditions of the apparatus during a plurality of most recent time intervals, wherein each of the pre-shaping vectors includes a plurality of values that compensate for effects of voltage variation of a power supply of the apparatus due to the triggering condition and the past operating conditions;

during a plurality of time intervals subsequent to the triggering condition, applying the respective values of the selected pre-shaping vector to respective information-carrying signals, thereby generating pre-shaped information-carrying signals; and generating signals for transmission during the plurality of subsequent time intervals based on applying the pre-shaped information-carrying signals to an active circuit of the apparatus, wherein the active circuit is powered by the power supply.

A2. The method of embodiment A1, wherein the apparatus comprises one or more transmitter circuit branches and one or more receiver circuit branches A2a. The method of embodiment A2, wherein the triggering condition includes one of the following being switched from an off state to an on state: at least a first number of transmitter circuit branches, or at least one but less than a second number of transmitter circuit branches.

A2b. The method of any of embodiments A2-A2a, wherein the past operating conditions of the apparatus include the following:

a number of the receiver circuit branches that are in an on state during each of the plurality of most recent time intervals, and a number of the transmitter circuit branches that are in an on state during each of the plurality of most recent time intervals.

A3. The method of any of embodiments A2-A2b, wherein:

the method further comprises determining whether the past operating conditions of the apparatus match any of one or more operating patterns associated with the triggering condition; and selecting one of a plurality of pre-shaping vectors comprises, based on detecting a match between the past operating conditions and a first operating pattern, selecting a pre-shaping vector corresponding to the triggering condition and the first operating pattern.

A3a. The method of embodiment A3, wherein the plurality of pre-shaping vectors are arranged in a codebook, with each pre-shaping vector in the codebook being associated with a unique index and a unique combination of the following: one of multiple predetermined triggering conditions, and one of multiple predetermined operating patterns.

A3b. The method of embodiment A3a, wherein:

selecting one of the pre-shaping vectors is performed by a pre-shaping controller, and further comprises sending an index corresponding to the selected pre-shaping vector to an arbitrary waveform generator (AWG); and the method further comprises, by the AWG, outputting the respective values of the pre-shaping vector associated with the received index during the plurality of time intervals subsequent to the triggering condition.

A4. The method of any of embodiments A3-A3b, wherein each operating pattern associated with the triggering condition includes one or more of the following:

a number of the receiver circuit branches that are in an on state during at least one most recent time interval, a minimum number of the receiver circuit branches that must be in an on state during at least one most recent time interval, a number of the transmitter circuit branches that are in an on state during at least one most recent time interval, a minimum number of the transmitter circuit branches that must be in an on state during at least one most recent time interval, and a maximum number of the transmitter circuit branches that can be in an on state during at least one most recent time interval.

A4a. The method of any of embodiments A3-A4, wherein the one or more operating patterns associated with the triggering condition include a plurality of operating patterns, with the plurality of operating patterns being differentiated based on number of time intervals, prior to the triggering condition, until one of the following occurs:

a non-zero number of receiver circuit branches are in an on state; or a non-zero number of transmitter circuit branches are in an on state.

A5. The method of any of embodiments A1-A4a, wherein the effects of voltage variation of a power supply include one or more of the following, during the plurality of time intervals subsequent to the associated triggering condition:

differences from desired power level of a signal output by the active circuit; and phase errors in the signal output by the active circuit.

A5a. The method of embodiment A5, wherein the plurality of values in each pre-shaping vector include one or more of the following that compensate for effects of voltage variation of the power supply during the plurality of time intervals subsequent to the associated triggering condition:

gains that are inverse of the differences from desired power level during the respective time intervals; and phase shifts that are inverse of the phase errors during the respective time intervals.

A6. The method of any of embodiments A1-A5a, further comprising configuring an operation mode of the power supply in accordance with the plurality of pre-shaping vectors, wherein the configured operation mode includes one or more of the following settings: pre-charge on or off, and pre-discharge on or off.

A7. The method of any of embodiments A1-A6, wherein applying the respective values of the selected pre-shaping vector to respective information-carrying signals is performed selectively based on an operation mode of the active circuit, wherein the operation mode of the active circuit includes one or more of the following settings:

pre-shaping on or off, pre-shaping performed for all or a subset of time intervals after a triggering event, pre-shaping performed for all or a subset of information-carrying signal types, and pre-shaping performed for all or a subset of information-carrying signal average properties.

A8. The method of any of embodiments A1-A7, further comprising configuring an operation mode of one or more additional circuits of the apparatus in accordance with the plurality of pre-shaping vectors, wherein the one or more additional circuits are powered by the power supply.

A9. The method of any of embodiments A1-A8, wherein the active circuit comprises a plurality of active circuits, the plurality of active circuits generate a respective plurality of signals for transmission during the plurality of subsequent time intervals based on a respective plurality of pre-shaped information-carrying signals.

A9a. The method of embodiment A9, wherein the respective plurality of pre-shaped information-carrying signals are generated based on one of the following:

applying a single selected pre-shaping vector to a plurality of different information-carrying signals; or selecting one of the plurality of pre-shaping vectors for each of the plurality of different information-carrying signals, and applying the plurality of selected pre-shaping vectors to the plurality of different information-carrying signals.

A10. The method of any of embodiments A1-A9a, wherein:

the method further comprises receiving, from a second controller associated with a second active circuit powered by the power supply, an indication of one or more of the following parameters: an operating mode for the second active circuit, and a second pre-shaping vector to be used for generating pre-shaped information-carrying signals input to the second active circuit; and one or more of the following is selected based on the indicated parameters: an operating mode of the active circuit, and the pre-shaping vector.

B1. An apparatus configured to generate one or more signals for transmission, the apparatus comprising:

a pre-shaping controller configured to:

detect a triggering condition related to a change in current operational status of the apparatus; and select one of a plurality of pre-shaping vectors based on the triggering condition and past operating conditions of the apparatus during a plurality of most recent time intervals, wherein each of the pre-shaping vectors includes a plurality of values that compensate for effects of voltage variation of a power supply of the apparatus due to the triggering condition and the past operating conditions;

a signal multiplier configured to, responsive to the pre-shaping controller, apply the respective values of the selected pre-shaping vector to respective information-carrying signals during a plurality of time intervals subsequent to the triggering condition, thereby generating pre-shaped information-carrying signals; and an active circuit powered by the power supply and configured to generate signals for transmission during the plurality of subsequent time intervals based on the pre-shaped information-carrying signals.

B2. The apparatus of embodiment B1, further comprising one or more transmitter circuit branches and one or more receiver circuit branches.

B2a. The apparatus of embodiment B2, wherein the triggering condition includes one of the following being switched from an off state to an on state: at least a first number of transmitter circuit branches, or at least one but less than a second number of transmitter circuit branches.

B2b. The apparatus of any of embodiments B2-B2a, wherein the past operating conditions of the apparatus include the following:

a number of the receiver circuit branches that are in an on state during each of the plurality of most recent time intervals, and a number of the transmitter circuit branches that are in an on state during each of the plurality of most recent time intervals.

B3. The apparatus of any of embodiments B2-B2b, wherein the pre-shaping controller is further configured to:

determine whether the past operating conditions of the apparatus match any of one or more operating patterns associated with the triggering condition; and based on detecting a match between the past operating conditions and a first operating pattern, select a pre-shaping vector corresponding to the triggering condition and the first operating pattern.

B4. The apparatus of any of embodiments B1-B3, further comprising an arbitrary waveform generator (AWG) configured to:

receive an index corresponding to the selected pre-shaping vector from the pre-shaping controller; and based on the index, output the respective values of the selected pre-shaping vector during the plurality of time intervals subsequent to the triggering condition.

B5. The apparatus of any of embodiments B1-B4, being further configured to perform operations corresponding to any of the methods of embodiments A4-A10.

B6. A user equipment (UE) comprising the apparatus of any of embodiments B1-B5.

B7. A network node of a communication network, the network node comprising the apparatus of any of embodiments B1-B5.

B8. A non-transitory, computer-readable medium storing computer-executable instructions that, when executed by a pre-shaping controller of an apparatus configured to generate one or more signals for transmission, configure the apparatus to perform operations corresponding to any of the methods of embodiments A1-A10.

B9. A computer program product comprising computer-executable instructions that, when executed by a pre-shaping controller of an apparatus configured to generate one or more signals for transmission, configure the apparatus to perform operations corresponding to any of the methods of embodiments A1-A10.

B10. A signal pre-shaping apparatus comprising:
a pre-shaping controller configured to:
detect a triggering condition related to a change in current operational status of an apparatus configured to generate one or more signals for transmission; and
select one of a plurality of pre-shaping vectors based on the triggering condition and past operating conditions of the apparatus during a plurality of most recent time intervals, wherein each of the pre-shaping vectors includes a plurality of values that compensate for effects of voltage variation of a power supply of the apparatus due to the triggering condition and the past operating conditions;
a signal multiplier configured to, responsive to the pre-shaping controller, apply the respective values of the selected pre-shaping vector to respective information-carrying signals during a plurality of time intervals subsequent to the triggering condition, thereby generating pre-shaped information-carrying signals.

The invention claimed is:

1. A method performed by an apparatus configured to generate output signals for transmission, the method comprising:
detecting a triggering condition related to a change in operational status of the apparatus;
selecting one of a plurality of pre-shaping vectors based on the triggering condition and past operating conditions of the apparatus during a plurality of most recent time intervals, wherein each of the pre-shaping vectors includes a plurality of values that compensate for effects of voltage variation of a power supply for the apparatus due to the triggering condition and the past operating conditions;
during a plurality of time intervals subsequent to the triggering condition, applying the respective values of the selected pre-shaping vector to respective information-carrying signals, thereby generating pre-shaped information-carrying signals; and
generating output signals for transmission during the plurality of subsequent time intervals, wherein the output signals are generated by an active circuit of the apparatus using the pre-shaped information-carrying signals, wherein the active circuit is powered by the power supply.

2. The method of claim 1, wherein the apparatus comprises one or more transmitter circuit branches and one or more receiver circuit branches.

3. The method of claim 2, wherein the triggering condition includes one of the following being switched from an off state to an on state: at least a first number of transmitter circuit branches, or at least one but less than a second number of transmitter circuit branches.

4. The method of claim 2, wherein the past operating conditions of the apparatus include the following:
a number of the receiver circuit branches that are in an on state during each of the plurality of most recent time intervals, and
a number of the transmitter circuit branches that are in an on state during each of the plurality of most recent time intervals.

5. The method of claim 2, wherein:
the method further comprises determining whether the past operating conditions of the apparatus match any of one or more operating patterns associated with the triggering condition; and
selecting one of a plurality of pre-shaping vectors comprises, based on detecting a match between the past operating conditions and a first operating pattern, selecting a pre-shaping vector corresponding to the triggering condition and the first operating pattern.

6. The method of claim 5, wherein the plurality of pre-shaping vectors are arranged in a codebook, with each pre-shaping vector in the codebook being associated with a unique index and a unique combination of the following: one of multiple predetermined triggering conditions, and one of multiple predetermined operating patterns.

7. The method of claim 5, wherein:
selecting one of the pre-shaping vectors is performed by a pre-shaping controller, and further comprises sending the selected pre-shaping vector, or an indication thereof, to an arbitrary waveform generator (AWG); and
the method further comprises, by the AWG, outputting the respective values of the selected pre-shaping vector during the plurality of time intervals subsequent to the triggering condition.

8. The method of claim 5, wherein each operating pattern associated with the triggering condition includes one or more of the following:
a number of the receiver circuit branches that are in an on state during at least one most recent time interval,
a minimum number of the receiver circuit branches that must be in an on state during at least one most recent time interval,
a number of the transmitter circuit branches that are in an on state during at least one most recent time interval,
a minimum number of the transmitter circuit branches that must be in an on state during at least one most recent time interval, and
a maximum number of the transmitter circuit branches that can be in an on state during at least one most recent time interval.

9. The method of claim 5, wherein the one or more operating patterns associated with the triggering condition include a plurality of operating patterns, with the plurality of operating patterns being differentiated based on number of time intervals, prior to the triggering condition, until one of the following occurs:
a non-zero number of receiver circuit branches are in an on state; or
a non-zero number of transmitter circuit branches are in an on state.

10. The method of claim 1, wherein the effects of voltage variation of a power supply include one or more of the following, during the plurality of time intervals subsequent to the associated triggering condition:
differences from desired power level of the output signal generated by the active circuit; and phase errors in the output signal generated by the active circuit.

11. The method of claim 10, wherein the plurality of values in each pre-shaping vector include one or more of the following that compensate for effects of voltage variation of the power supply during the plurality of time intervals subsequent to the associated triggering condition:

gains that are inverse of the differences from desired power level during the respective time intervals; and phase shifts that are inverse of the phase errors during the respective time intervals.

12. The method of claim 1, further comprising configuring an operation mode of the power supply in accordance with the plurality of pre-shaping vectors, wherein the configured operation mode includes one or more of the following settings: pre-charge on or off, and pre-discharge on or off.

13. The method of claim 1, wherein applying the respective values of the selected pre-shaping vector to respective information-carrying signals is performed selectively based on an operation mode of the active circuit, wherein the operation mode of the active circuit includes one or more of the following settings:

pre-shaping on or off, pre-shaping performed for all or a subset of time intervals after a triggering event, pre-shaping performed for all or a subset of information-carrying signal types, and pre-shaping performed for all or a subset of information-carrying signal average properties.

14. The method of claim 1, further comprising configuring an operation mode of one or more additional circuits of the apparatus in accordance with the plurality of pre-shaping vectors, wherein the one or more additional circuits are powered by the power supply.

15. The method of claim 1, wherein the active circuit comprises a plurality of active circuits that generate a respective plurality of output signals for transmission during the plurality of subsequent time intervals based on a respective plurality of pre-shaped information-carrying signals.

16. The method of claim 15, wherein the respective plurality of pre-shaped information-carrying signals are generated based on one of the following:

applying a single selected pre-shaping vector to a plurality of different information-carrying signals; or selecting one of the plurality of pre-shaping vectors for each of the plurality of different information-carrying signals, and applying the plurality of selected pre-shaping vectors to the plurality of different information-carrying signals.

17. The method of claim 1, wherein:

the method further comprises receiving, from a second controller associated with a second active circuit powered by the power supply, an indication of one or more of the following parameters: an operating mode for the second active circuit, and a second pre-shaping vector to be used for generating pre-shaped information-carrying signals input to the second active circuit; and one or more of the following is selected based on the indicated parameters: an operating mode of the active circuit, and the pre-shaping vector.

18. The method of claim 1, further comprising, during each time interval of the plurality of subsequent time intervals:

obtaining a representation of the signal generated by the active circuit for the time interval;

determining a performance metric based on the representation of the signal generated by the active circuit and on the information-carrying signal for the time interval; and based on the performance metric, adjusting the value of the selected pre-shaping vector for the time interval.

19. The method of claim 18, wherein:

the representation of the signal generated by the active circuit is obtained via reception by a transmitter observation receiver;

the performance metric is a complex error signal generated by a divider circuit from inputs of the representation of the signal generated by the active circuit and a delayed version of the information-carrying signal for the time interval; and the value of the selected pre-shaping vector is adjusted via multiplication by an inverse of the complex error signal.

20. An apparatus configured to generate output signals for transmission, the apparatus comprising:

a pre-shaping controller configured to:

detect a triggering condition related to a change in operational status of the apparatus; and select one of a plurality of pre-shaping vectors based on the triggering condition and past operating conditions of the apparatus during a plurality of most recent time intervals, wherein each of the pre-shaping vectors includes a plurality of values that compensate for effects of voltage variation of a power supply for the apparatus due to the triggering condition and the past operating conditions;

a signal multiplier configured to, responsive to the pre-shaping controller, apply the respective values of the selected pre-shaping vector to respective information-carrying signals during a plurality of time intervals subsequent to the triggering condition, thereby generating pre-shaped information-carrying signals; and an active circuit powered by the power supply and configured to generate output signals for transmission during the plurality of subsequent time intervals using the pre-shaped information-carrying signals.

21. The apparatus of claim 20, further comprising one or more transmitter circuit branches and one or more receiver circuit branches.

22. The apparatus of claim 21, wherein the triggering condition includes one of the following being switched from an off state to an on state: at least a first number of transmitter circuit branches, or at least one but less than a second number of transmitter circuit branches.

23. The apparatus of claim 22, wherein the past operating conditions of the apparatus include the following:

a number of the receiver circuit branches that are in an on state during each of the plurality of most recent time intervals, and a number of the transmitter circuit branches that are in an on state during each of the plurality of most recent time intervals.

24. The apparatus of claim 22, wherein the pre-shaping controller is further configured to:

determine whether the past operating conditions of the apparatus match any of one or more operating patterns associated with the triggering condition; and based on detecting a match between the past operating conditions and a first operating pattern, select a pre-shaping vector corresponding to the triggering condition and the first operating pattern.

25. The apparatus of claim 20, further comprising an arbitrary waveform generator (AWG) configured to:

receive the selected pre-shaping vector, or an indication thereof, from the pre-shaping controller; and output the respective values of the selected pre-shaping vector during the plurality of time intervals subsequent to the triggering condition.

26. The apparatus of claim 20, further comprising:

a transmitter observation receiver configured to obtain a representation of the signal generated by the active circuit during each time interval of the plurality of subsequent time intervals; and a divider circuit configured to generate a complex error signal from inputs of the representation of the signal generated by the active circuit and a delayed version of the information-carrying signal for the time interval, wherein the pre-shaping controller is further configured to adjust the value of the selected pre-shaping vector for the time interval via multiplication by the inverse of the complex error signal.

27. A non-transitory, computer-readable medium storing computer-executable instructions that, when executed by a pre-shaping controller of an apparatus configured to generate output signals for transmission, configure the apparatus to:

detect a triggering condition related to a change in operational status of the apparatus;

select one of a plurality of pre-shaping vectors based on the triggering condition and past operating conditions of the apparatus during a plurality of most recent time intervals, wherein each of the pre-shaping vectors includes a plurality of values that compensate for effects of voltage variation of a power supply for the apparatus due to the triggering condition and the past operating conditions;

during a plurality of time intervals subsequent to the triggering condition, apply the respective values of the selected pre-shaping vector to respective information-carrying signals, thereby generating pre-shaped information-carrying signals; and generate output signals for transmission during the plurality of subsequent time intervals, wherein the output signals are generated by an active circuit of the apparatus using the pre-shaped information-carrying signals, wherein the active circuit is powered by the power supply.

* * * * *